United States Patent [19]

Yoshizawa et al.

[11] Patent Number: 5,097,204
[45] Date of Patent: Mar. 17, 1992

[54] METHOD AND APPARATUS FOR EVALUATING THE CAPACITANCE OF AN INTEGRATED ELECTRONIC DEVICE USING AN E BEAM

[75] Inventors: Masahiro Yoshizawa; Akira Kikuchi, both of Kanagawa; Kou Wada, Tokyo; Minpei Fujinami, Tokyo; Nobuo Shimazu, Tokyo, all of Japan

[73] Assignee: Nippon Telegraph and Telephone Public Corporation, Tokyo, Japan

[21] Appl. No.: 592,560

[22] Filed: Oct. 3, 1990

Related U.S. Application Data

[62] Division of Ser. No. 166,763, Mar. 3, 1988, Pat. No. 4,980,639.

[30] Foreign Application Priority Data

| Mar. 11, 1985 | [JP] | Japan | 60-48070 |
| Jun. 17, 1985 | [JP] | Japan | 60-129937 |
| Aug. 12, 1985 | [JP] | Japan | 60-177448 |

[51] Int. Cl.⁵ ............... G01R 17/02; G01R 31/26
[52] U.S. Cl. ............... 324/158 R; 324/158 D; 324/73.1; 324/678; 250/310
[58] Field of Search ............... 324/158 R, 158 D, 501, 324/71.3, 678, 73.1; 250/310, 311, 492.1; 356/400

[56] References Cited

U.S. PATENT DOCUMENTS

| 3,995,216 | 11/1976 | Yun | 324/158 D |
| 4,460,866 | 7/1984 | Feuerbaum et al. | 324/71.3 |
| 4,695,794 | 9/1987 | Bargett et al. | 324/158 D |
| 4,788,495 | 11/1988 | Plies | 324/158 R |
| 4,851,768 | 7/1989 | Yoshizawa et al. | 324/158 R |

OTHER PUBLICATIONS

Feuerbaum; "VLSI Testing Using the Electron Probe"; Scanning Electron Microscopy 1979; pp. 285-296.
Menzel et al.; "Secondary Electron Detection Systems for Quantitative Voltage Measurements"; Scanning vol. 5, 4 (1983).

*Primary Examiner*—Kenneth A. Wieder
*Assistant Examiner*—Vinh P. Nguyen
*Attorney, Agent, or Firm*—Remy J. VanOphem

[57] ABSTRACT

A method and apparatus for testing an integrated electronic device wherein the integrated electronic device to be tested is placed on a sample table. A predetermined position of the integrated electronic device is irradiated with the primary charged beam. A substrate current flowing through a substrate of the integrated electronic device is measured upon radiation of the primary charged beam, and then a potential of the predetermined position irradiated with the primary charged beam is nondestructively measured in accordance with secondary electrons emitted from the predetermined position. A function of the integrated electronic device is evaluated in accordance with the substrate current and the predetermined position potential. The function to be evaluated includes leakage characteristics and a capacitance.

6 Claims, 25 Drawing Sheets

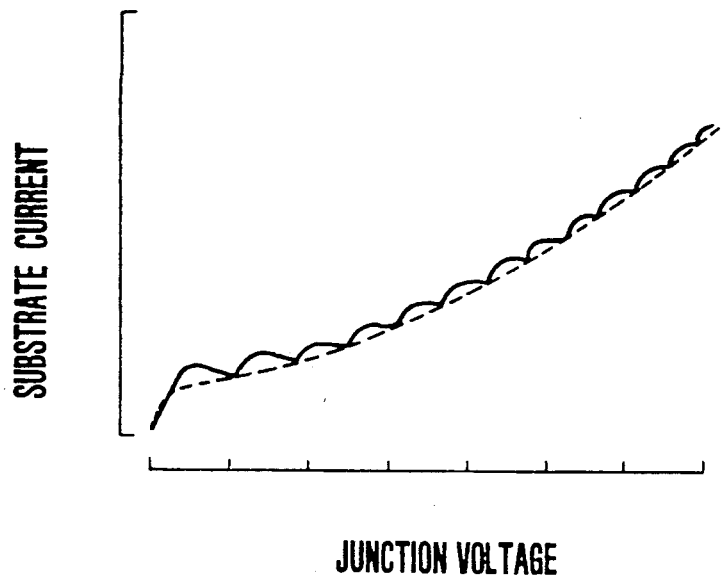
FIG. 15
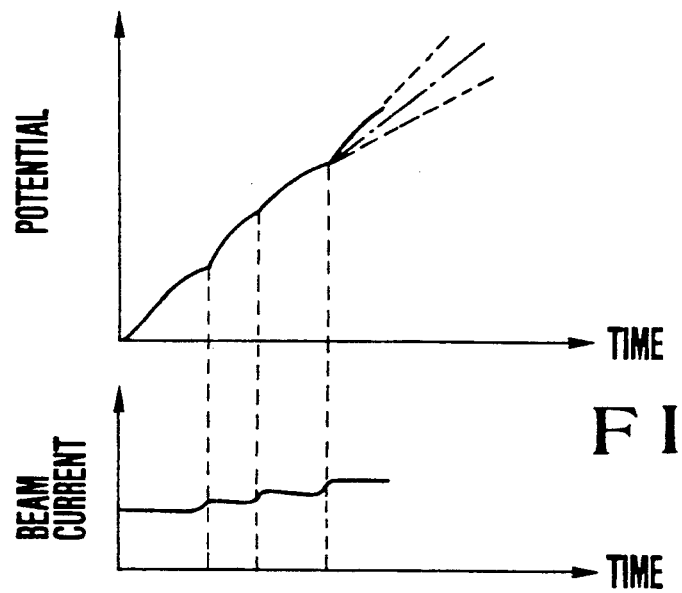
FIG. 16A
FIG. 16B

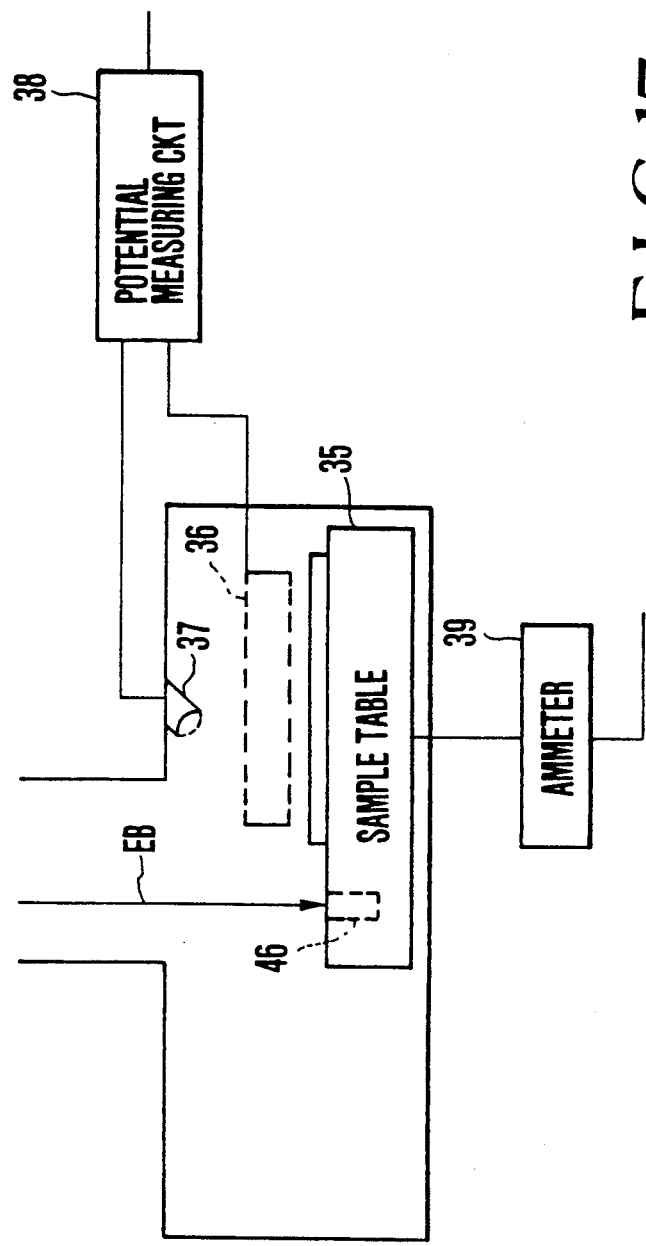
F I G. 17

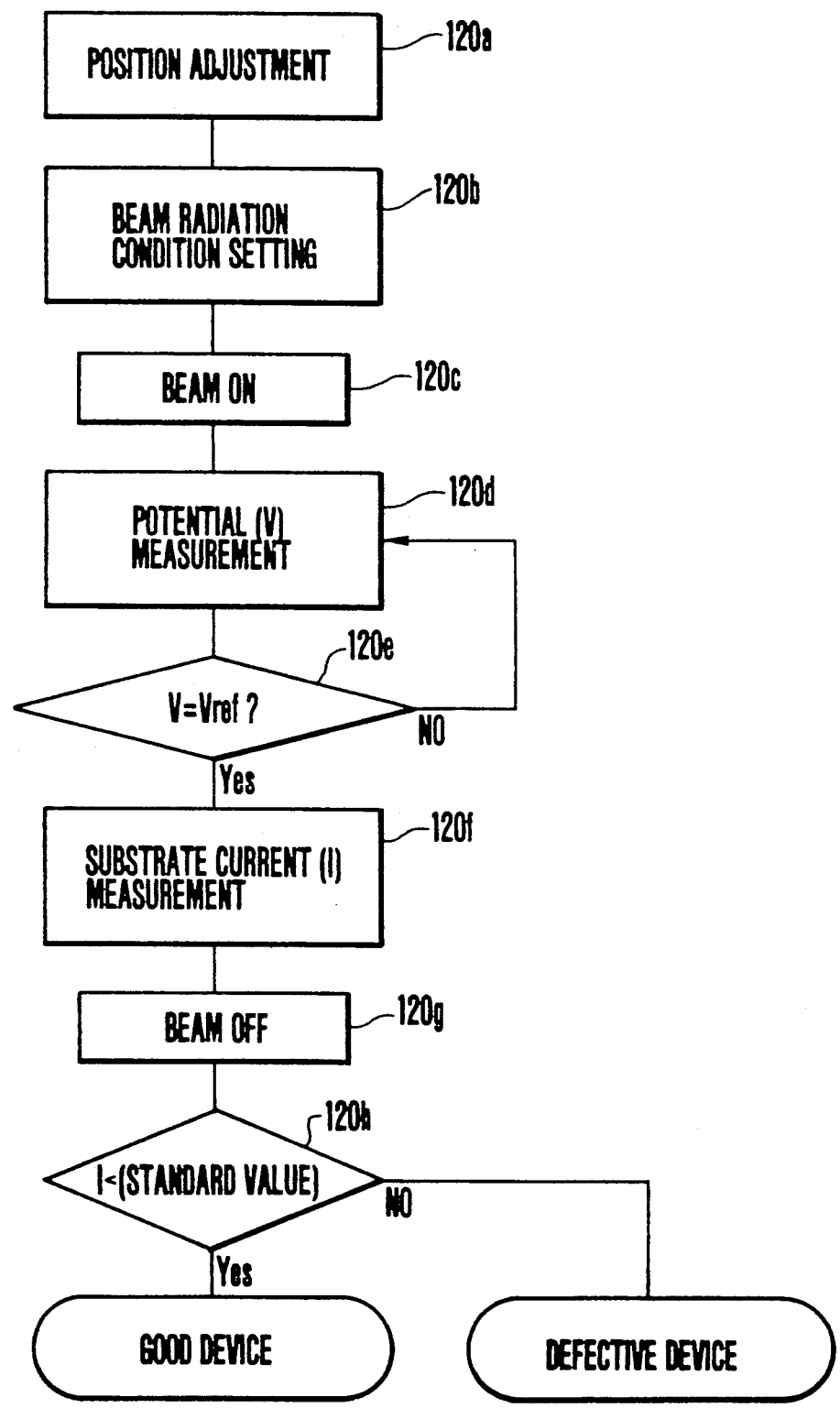
F I G. 24

METHOD AND APPARATUS FOR EVALUATING THE CAPACITANCE OF AN INTEGRATED ELECTRONIC DEVICE USING AN E BEAM

This is a division of application Ser. No. 07/166,763, filed Mar. 3, 1988, now U.S. Pat. No. 6,980,639.

BACKGROUND OF THE INVENTION

The present invention relates to a method and apparatus for testing an integrated electronic device.

Micropatterning techniques have been quickly developed along with recent advances in electronic technology. In association with the development of micropatterning techniques, tests for integrated electronic devices have been an important factor for providing high-performance, low-cost devices.

Tests for finished electronic devices and tests during the fabrication process for electronic devices are very important for measuring electronic characteristics of integrated electronic devices. Devices that have poor test results are subjected to appropriate corrections in order to increase the yield of good devices and hence decrease the fabrication cost.

In order to test semi-finished electronic devices during the manufacturing process, probes of a specific test device for testing a specific process are directly brought into contact with predetermined positions of each electronic device to measure electronic characteristics thereof. This method is effective when electronic devices have a large circuit pattern and a low integration density. However, a minimum size for such probes is limited, and this conventional testing method is not suitable for electronic devices fabricated in a submicron process.

Another conventional electronic device electrical characteristic measuring apparatus of this type is exemplified by an electron beam tester with a potential measuring apparatus incorporated in a conventional scanning electron microscope. A predetermined driver is mechanically connected to an input side of each electronic device, and a measuring position is irradiated with a pulse beam pulsated in response to basic clocks supplied from the driver. A voltage contrast image of the electronic device is obtained on the basis of the magnitude of a secondary electron signal detected by the irradiated position.

Since the electronic device receives the basic clocks from its input side to form the voltage contrast image upon actual operation thereof, the device must be a finished product. Therefore, this conventional tester is not suitable for measuring electrical characteristics of electronic devices during their fabrication process. This technique is described in "VLSI TESTING USING ELECTRON PROBE", *Scanning Electron Microscopy*, Vol. 1.1, (1979), P. 285.

SUMMARY OF THE INVENTION

It is, therefore, a principal object of the present invention to provide a method and apparatus for testing an integrated electronic device, wherein electrical characteristics of the integrated electronic device can be measured by nondestructive testing and without positive contact with the electronic device In order to achieve the above object according to an aspect of the present invention, there is provided a method of testing an integrated electronic device, including the steps of placing an integrated electronic device to be tested on a sample table and radiating a primary charged beam onto a predetermined position of the electronic device; measuring a substrate current flowing through a substrate of the electronic device upon radiation of the primary charged beam, and at the same time measuring a potential at the predetermined position irradiated with the primary charged beam; and evaluating a function of the electronic device in accordance with the substrate current and the potential at the predetermined position According to another aspect of the present invention, there is provided an apparatus for measuring an integrated electronic device having means for radiating a primary charged beam onto a predetermined position of an integrated electronic device placed on a sample table; means for measuring a substrate current flowing through a substrate of the electronic device upon radiation of the primary charged beam; means for measuring a potential at the predetermined position irradiated with the primary charged beam; and means for performing function evaluation processing for the electronic device in accordance with the substrate current and the potential.

BRIEF DESCRIPTION OF THE DRAWINGS

FIG. 15 is a graph showing changes in junction voltage and substrate current as a function of time when a p-n junction is irradiated with the charged beam at a constant current;

FIG. 16A is a graph showing a method of setting a change in potential as a function of time;

FIG. 16B is a graph showing a method of setting a change in beam current as a function of time;

FIGS. 17, 18, 19 and 20 are system block diagrams showing apparatuses for testing an integrated electronic device according to still other embodiments of the present invention; and FIGS. 21 to 30 are flow charts for explaining the operation of a signal processor when a computer is used as the signal processor.

DETAILED DESCRIPTION OF THE PREFERRED EMBODIMENTS

Figure 1:
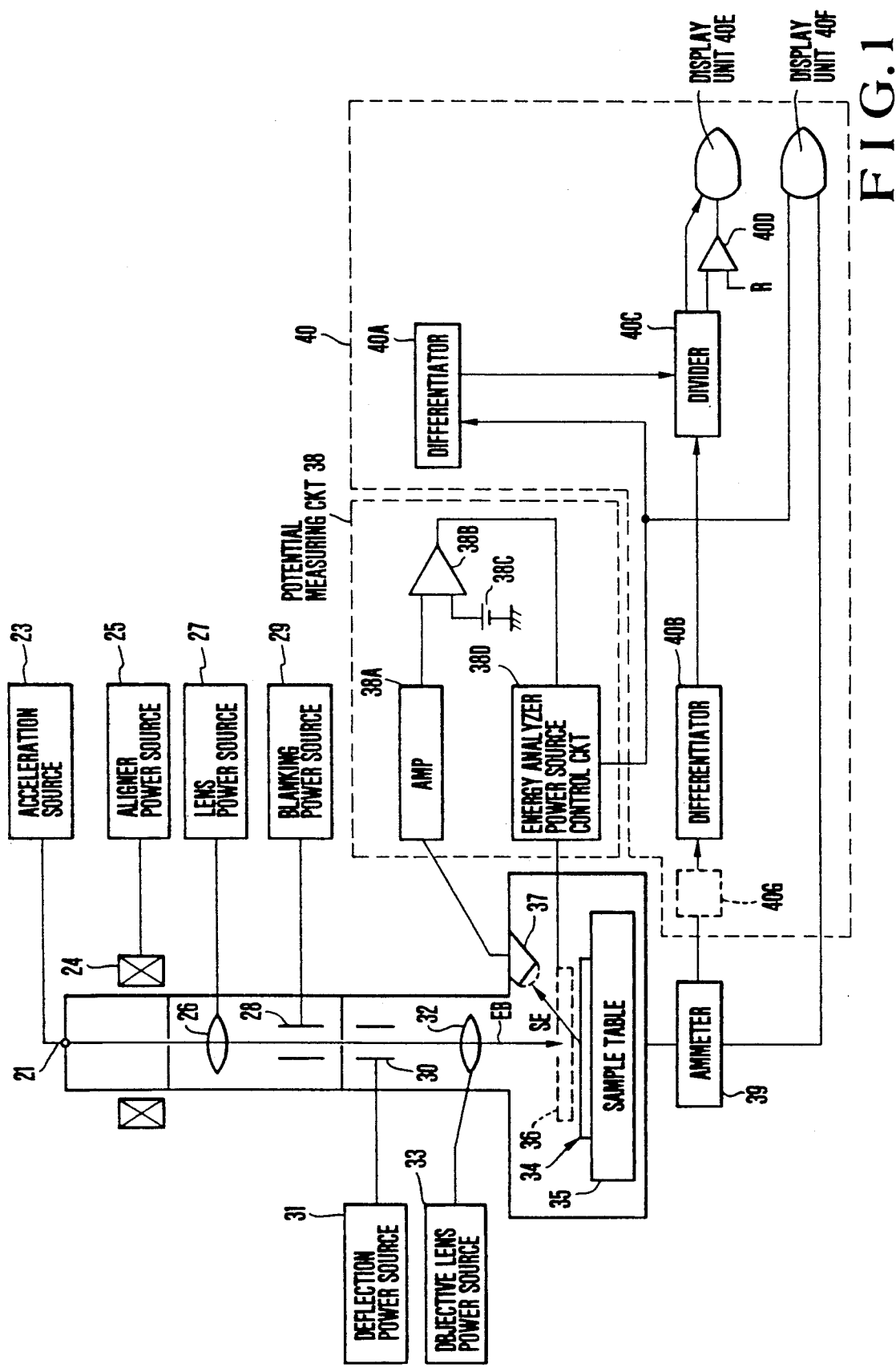
FIG. 1 is a system block diagram showing an apparatus for testing an integrated electronic device according to an embodiment of the present invention.

FIG. 1 shows an apparatus for testing an integrated electronic device according to an embodiment of the present invention. Referring to FIG. 1, a charged beam EB generated by a charged beam source 21 is accelerated by an acceleration source 23, and an integrated electronic device 34 placed on a sample table 35 is irradiated with the accelerated charged beam EB. Reference numeral 24 denotes an aligner; 25, a power source for the aligner 24; 26, a lens; 27, a lens power source for controlling the power of the lens 26; 28, a blanker; 29, a blanking power source for the blanker 28; 30, a deflector as a radiation means; 31, a deflection power source for the deflector 30; 32, an objective lens; and 33, a power source for the objective lens 32. The optical axis of the charged beam EB generated by the charged beam source 21 is aligned by the aligner 24, so that the charged beam EB is focused by the lens 26 before it reaches the electronic device 34 placed on the sample table 35. The lens 26 also serves to change an amount of beam current supplied to the electronic device on the sample table 35. The charged beam EB is deflected by the deflector 30 such that a predetermined position on the electronic device 34 is irradiated with the deflected charged beam EB. The charged beam EB is also subjected to focusing adjustment. The predetermined position of the electronic device 34 on the sample table 35 is thus irradiated with the primary charged beam.

When the electronic device 34 is irradiated with the primary charged beam, an energy analyzer 36, a secondary electron detector 37 and a potential measuring circuit 38 measure a potential at the position of the electronic device irradiated with the primary electron beam. The energy analyzer 36 and the secondary electron detector 37 are arranged above the electronic device 34. The energy analyzer 36 measures as an electrode potential a potential at the predetermined position on the electronic device 34 irradiated with the primary charged beam. The secondary electron detector 37 detects the secondary electrons emitted from the electronic device 34 upon radiation of the primary charged beam.

The potential measuring circuit 38 includes an amplifier 38A for amplifying an output from the secondary electron detector 37, a differential amplifier 38B for receiving the output from the amplifier 38A and an output from a reference voltage source 38C and generating the difference between the output from the amplifier 38A and that from the reference voltage source 38C, and an energy analyzer voltage control circuit 38D for receiving the output from the differential amplifier 38B to control a voltage applied to the energy analyzer 36 such that the output from the secondary electron detector 37 is set at a given value, i.e., the output from the amplifier 38A is equal to that from the reference voltage source 38C. For example, the output from the reference voltage source 38C is set to equal the secondary electron signal when a potential at the electronic device 34 is 0V. The potential at the electronic device 34 is measured by the energy analyzer voltage control circuit 38D in accordance with a change in voltage input to the energy analyzer 36. The energy analyzer 36 is described in detail by "Secondary Electron Detection System for Quantitative Voltage Measurements" *Scanning*, Vol. 5, (1983), p. 151.

An ammeter 39 detects a substrate current of the electronic device 34 arranged on the sample table 35. The sample table 35 has a structure wherein a portion thereof contacting the substrate of the electronic device 34 is made of a metal plate, and this metal plate is connected to the ammeter 39.

Figure 2:
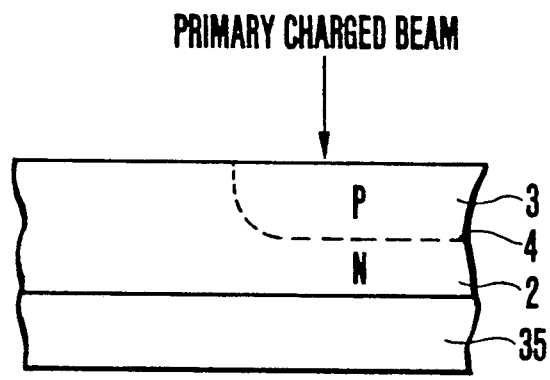
FIGS. 2, 3 and 4 are enlarged sectional views showing parts of electronic devices to be tested by the apparatus of FIG. 1.

The electronic device 34 used in this embodiment is one with an integrated circuit formed on an n-type semiconductor substrate 2 placed on the sample table 35, as shown in FIG. 2. For the sake of simplicity, a p-type semiconductor region 3 is formed in the n-type semiconductor substrate 2 to constitute a p-n junction 4 of the semiconductor device.

Figure 3:
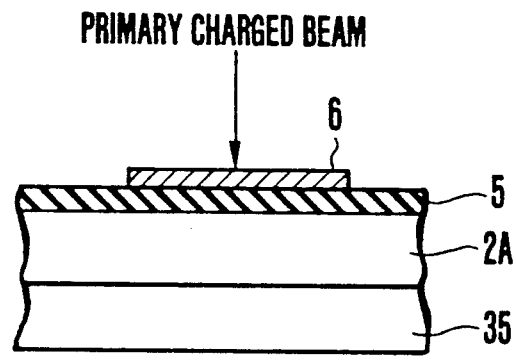

FIG. 3 shows another example of the electronic device 34 employing the present invention. This electronic device 34 exemplifies a MOS capacitor. Referring to FIG. 3, an insulating film 5 is formed on a semiconductor substrate 2A placed on the sample table 35, and a metal electrode 6 is formed on the insulating film 5.

Figure 4:
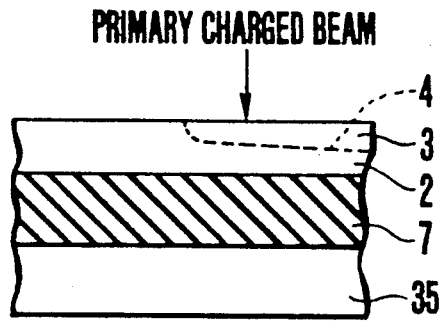

FIG. 4 shows still another example of the electronic device 34. An insulating substrate 7 is placed on the sample table 35, and semiconductor regions 2 and 3 constituting a p-n junction 4 are formed thereon.

The p-n junctions are exemplified in FIGS. 2 and 4 wherein p-type semiconductor regions are formed on n-type semiconductor regions. However, an n-type semiconductor region can be formed on a p-type semiconductor substrate to constitute a p-n junction, and measurement can be performed.

Even if the lower surfaces of the semiconductor substrates in FIGS. 2 and 3 are covered with insulating films such as oxide films, measurement can be performed.

Returning to FIG. 1, the outputs from the potential measuring circuit 38 and the ammeter 39 are supplied to a signal processor 40 to perform a function evaluation of the electronic device 34 placed on the sample table 35. The illustrated signal processor 40 discriminates whether the electronic device 34 is good or defective in accordance with the substrate current-electrode potential characteristics of the electronic device 34. The signal processor 40 includes a differentiator 40A for calculating a time differential of the potential upon reception of the radiation point potential as the output from the potential measuring circuit 38; a differentiator 40B for differentiating the output from the ammeter 39; a divider 40C for calculating a ratio of the time differential of the substrate current output from the differentiator 40B to the time differential of the electrode potential from the differentiator 40A; a comparator 40D for comparing an output from the divider 40C with a reference value R; a display unit 40E for displaying a discrimination result of the measured electronic device 34 in accordance with the output from the comparator 40D; and a display unit 40F for displaying the substrate current-potential characteristics in accordance with the measured potential from the energy analyzer voltage control circuit 38D in the potential measuring circuit 38 and the substrate current from the ammeter 39.

The operation of the test apparatus with the signal processor 40 will be described hereinafter.

The predetermined position of the electronic device 34 to be tested on the sample table 35 is irradiated with an electron beam EB. In this case, the operations of the acceleration source 23, the aligner power source 25, the lens power source 27, the blanking power source 29, the deflection power source 31, and the objective lens power source 33 are the same as those in a conventional scanning electron microscope, and a detailed description thereof will be omitted.

When the predetermined position of the electronic device 34 on the sample table 35 is irradiated with the electron beam EB, secondary electrons SE are emitted from the irradiated portion and are detected by the detector 37. At the same time, a potential of the secondary electrons SE is detected by the potential measuring circuit 38. In addition, a substrate current is generated in the electronic device 34 upon radiation of the electron beam EB and is detected by the current detector or ammeter 39.

Figure 5:
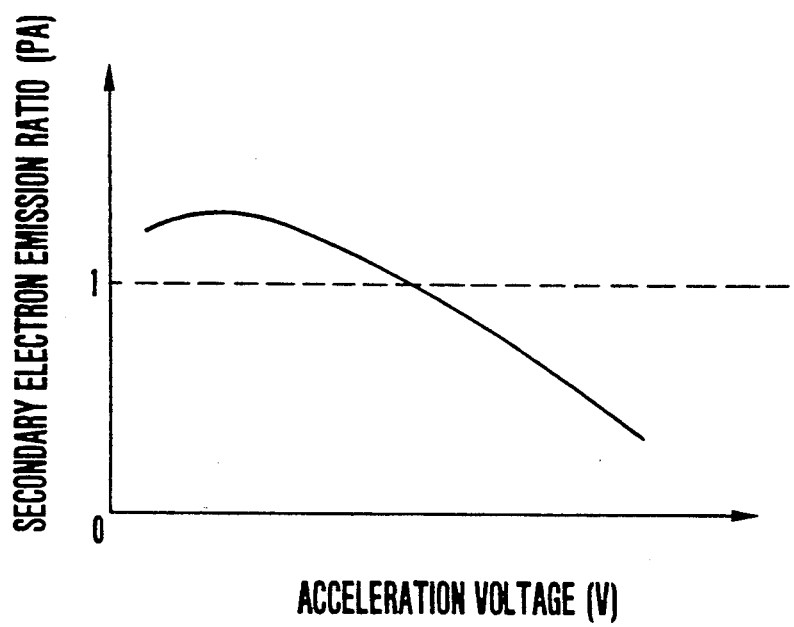
FIG. 5 is a graph showing a secondary electron emission ratio $\delta$ as a function of acceleration voltage.

FIG. 5 shows the acceleration voltage dependency of a secondary electron emission ratio $\delta$ when an electron beam is emitted as the primary charged beam. The secondary electron emission ratio $\delta$ has a peak at an acceleration voltage range from several hundreds of volts to 2,000V, in accordance with the materials of electronic devices to be tested. In the voltage range excluding the above range, the ratio is decreased upon an increase in acceleration voltage. The secondary electron emission ratio $\delta$ is larger or smaller than 1 in accordance with the magnitude of the acceleration voltage. When the ratio $\delta$ is larger than 1, the electronic device is positively charged. However, when the ratio $\delta$ is smaller than 1, the electronic device is negatively charged.

Figure 6:
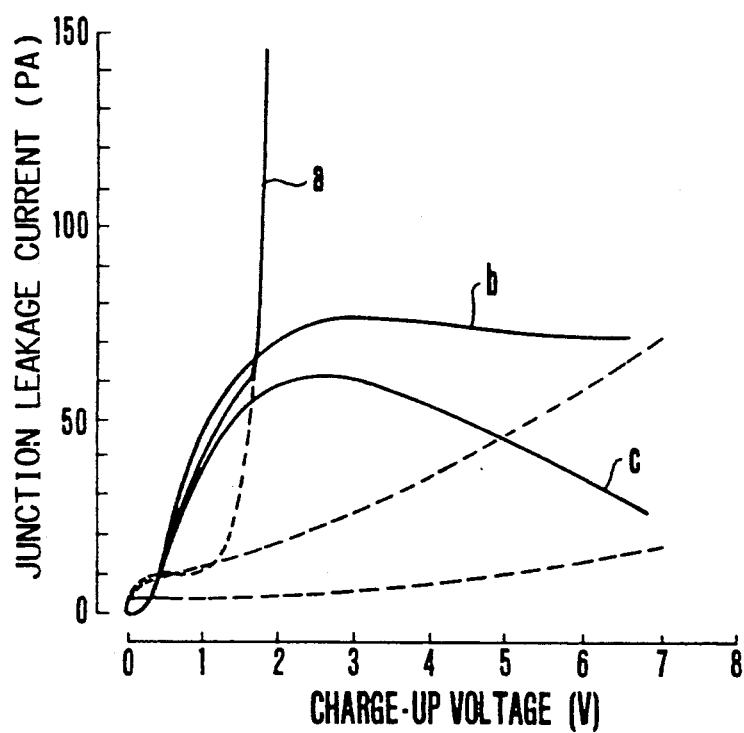
FIG. 6 is a graph showing a charge-up voltage as a function of a junction leakage current.

The substrate current generated in the electronic device 34 is changed in accordance with the structure of the electronic device 34 itself. Assume that a p-n junction is formed in a semiconductor substrate, as shown in FIG. 2. FIG. 6 shows the relationship between the p-n junction voltage (i.e., a charge-up voltage) and the substrate current (i.e., a junction leakage current) when the p-n junction is irradiated with the electron beam. The semiconductor substrate 2 is a n-type silicon, and the well region 3 is a p-type semiconductor. An acceleration voltage is 4 kV and a beam current is 200 pA. The junction voltage and the substrate current increase as a function of time. The solid line in FIG. 6 indicates substrate current-junction voltage measurement results obtained by using an electron beam, and the broken line indicates measurement results obtained using a conventional mechanical probe system. The current value of the electron beam is predetermined in the case represented by the solid line, while the voltage applied to the electrode is predetermined in the case represented by the broken line. The measured substrate current values vary in accordance with which one of the voltage and current is supplied. When a current is supplied to the substrate, a larger substrate current can be measured. When the same measurement by a method using an electron beam was performed using the mechanical probe method with a current source, the same substrate current-voltage indicated by the solid line can be obtained. Referring to FIG. 6, characteristic curve a represents substrate current-voltage characteristics of a defective electronic device with a large leakage current. Characteristic curves b and c represent substrate current-voltage characteristics of good electronic devices. A potential in the defective electronic device does not substantially increase at an intermediate point while its substrate current abruptly increases. However, in the good electronic devices, the substrate current decreased after it became saturated or peaked.

For example, in curves b and c of the good devices, the substrate current at a voltage of 2V is 60 to 80 pA. However, in curve a of the defective device, the substrate current is almost equal to the beam current of 200 pA. These test results are obtained when the beam current is made constant. However, when the voltage is made constant by the electron beam irradiation, the same substrate current as that (indicated by the broken line) of the mechanical probe method is obtained In curve a of the defective device, the substrate current is substantially the same as the beam current of 200 pA. When the constant potential is increased, it cannot be increased to over the increased potential in curve a of the defective device, thereby testing the electronic devices practically For example, when the electronic device is tested on the basis of the junction leakage, a ratio G of the time differential (dI/dt) of the substrate current I to the time differential (dV/dt) of the junction voltage V is determined. The electronic device is evaluated as to whether the G value of is larger or smaller than a given value. The circuit arrangement for performing such discrimination is exemplified by the signal processor 40. The output (the junction voltage V) from the potential measuring circuit 38 is supplied to the differentiator 40A, and the output (the substrate current I) from the ammeter 39 is supplied to the differentiator 40B. The divider 40C calculates the ratio (dI/dV = G) of the output from the differentiator 40B to that from the differentiator 40A. The comparator 40D determines if G is larger than a predetermined value R, thereby discriminating whether the electronic device 34 is good or defective. A discrimination result is displayed on the display unit 40E.

In a normal p-n junction, the substrate current is saturated and G is decreased as a function of time. However, when a leakage current is large, the substrate current is not saturated, and G is increased. Therefore, the electronic device can be determined as a good or defective device in accordance with the magnitude of G. The presence/absence of the leakage current can be detected by checking only dI/dt. However, it takes a long period of time to saturate the substrate current, and a shorter testing period is required to detect G = dI/dV so as to evaluate whether the electronic device is good or defective. The measurement results using the electron beam, as shown in FIG. 6, gradually come near that using the mechanical probe method and supplying a voltage. Therefore, the substrate current-voltage characteristics provide quantitative measurement of the magnitude of the junction leakage current as well as the junction leakage current values.

When the saturated substrate current and potential are measured while the beam current is varied, the same substrate current-voltage characteristics as in the mechanical probe method can be obtained. In gate and junction leakage measurement, the substrate current-voltage characteristics at a constant beam current are measured. By measuring the time differential (dV/dt) of the substrate potential or the time differential (dI/dt) of the substrate current, or by measuring a beam current required for providing a given substrate potential, interwafer or interchip measurement can be quantitatively performed. However, when the leakage component is large, the substrate current is not saturated and measurement readings increase. When the substrate potential is set at a given value, the readings are small if a ratio (I/V) of substrate current to its potential or a ratio (dI/dt)/V of the time differential of the substrate current to the substrate potential is small. However, when the leakage component is large, the readings increase.

Therefore, the subsrate current-voltage characteristics determine a magnitude of the leakage component.

Figure 7:
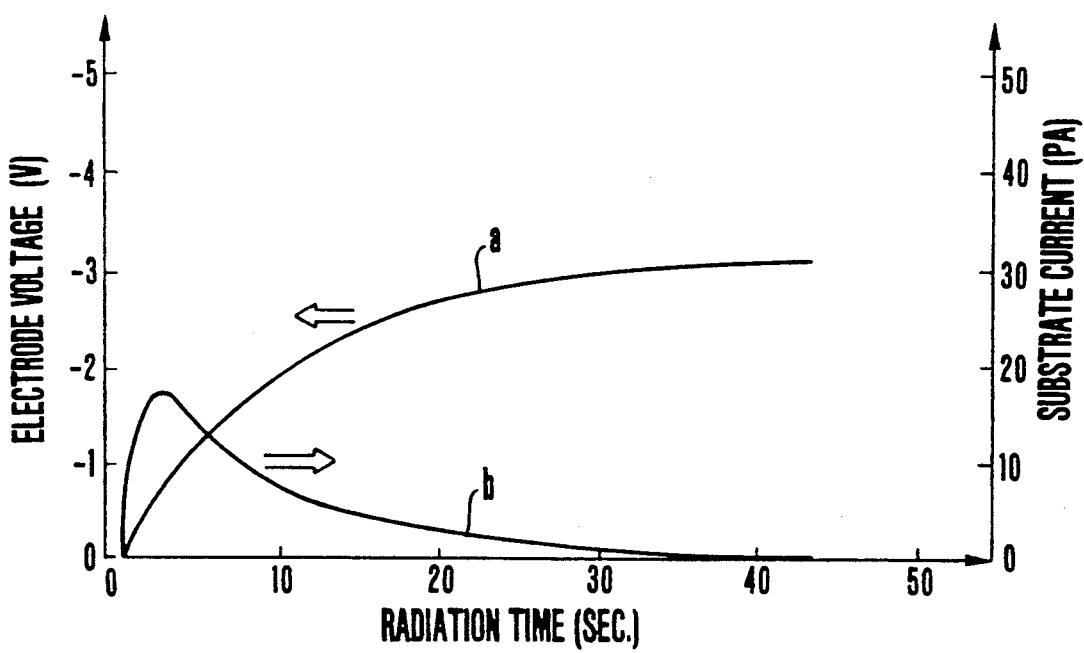
FIG. 7 is a graph showing an electrode potential and a substrate current as a function of radiation time when a MOS capacitor is used as the electronic device.

Assume that the electronic device is a MOS capacitor as shown in FIG. 3. In this case, when the metal electrode 6 of the MOS capacitor is irradiated with the electron beam EB, the electrode 6 is positively charged if the secondary electrode emission ratio $\delta > 1$. However, if the ratio $\delta < 1$, the electrode 6 is negatively charged. When the electrode 6 is not connected to external wiring, a potential at the electrode 6 changes as a function of time. FIG. 7 shows characteristic curves a and b respectively representing changes in electrode potential and substrate current as a function of time when the MOS capacitor is irradiated with the electron beam. In this case, the semiconductor substrate 2A is silicon, the insulating film 5 is a 1,200-Å thick silicon oxide film, and the electrode 6 is a 500-μm square polysilicon. An acceleration voltage is 3 kV, and the electrode 6 is negatively charged since the secondary electron emission ratio $\delta < 1$. As is apparent from curve a of FIG. 7, an electrode potential is decreased as a function of time, and the change is exponential. In other words, initial changes are large, and changes are gradually decreased and saturated. Although initial changes in substrate current are large and the subsequent changes gradually decrease in curve b of FIG. 7, the substrate current is decreased to zero after the charge of the good MOS capacitor reaches its peak. In a MOS capacitor with a large gate leakage, the substrate current is not decreased to zero and saturated to the leak current. Therefore, the magnitude of gate leakage can be detected by a magnitude of G or $(dI/dt)/V$ in the same manner as for junction leakage. It should be noted that the electrode 6 of the MOS capacitor can be positively charged when it is irradiated with the electron beam at an acceleration voltage satisfying condition $\delta > 1$, or when the electrode 6 is irradiated with a positively charged ion beam. In the measurement shown in FIG. 7, although an electronic device with a large electrode area is used, electronic devices with smaller circuit patterns can also be measured with this method.

Figure 8:
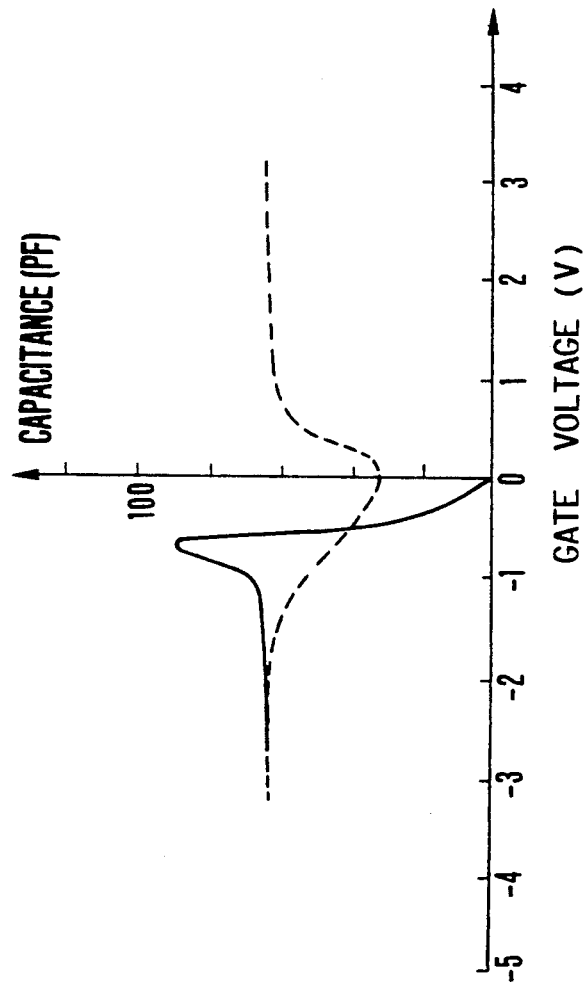
FIG. 8 is a graph showing a capacitance of the MOS capacitor as a function of a gate electrode potential.

In order to measure a capacitance of the MOS capacitor in the signal processor 40 in FIG. 1, a substrate current extracted from the ammeter 39 is integrated by an integrator 40G (indicated by the broken line), and an integral is supplied to the differentiator 40B. The differentiator 40A also receives an output from the potential measuring circuit 38. Outputs from the differentiators 40A and 40B are supplied to the divider 40C. The result is directly supplied to the display unit 40E, thereby displaying a capacitance C. The capacitance (C)-gate electrode potential (V) characteristics are shown in FIG. 8. Referring to FIG. 8, the solid line represents measurement results using an electron beam, and the broken line represents the measurement of quasistatic C-V characteristics obtained by the mechanical probe method. In this case, the potential is deviated from zero over the radiation time. The C-V represented by the solid line is also plotted such that the gate voltage is deviated over the radiation time. In a low electrode potential region, i.e., a region that has just been under beam radiation, the capacitance C is more abruptly changed by the electron beam method than that by the mechanical probe method. As can be easily seen, the test results of these two methods are not similar to each other. However, in an electrode potential saturation region, the absolute values of the test results of these methods coincide with each other. Therefore, the absolute value of the capacitance C in the potential saturation region can be measured. In a potential unsaturated region, an increase ratio of the capacitance and an abnormal flat band voltage VFB from the rise time of the MOS capacitor can be detected.

According to the present invention, the leakage component and the capacitance of electronic devices can be measured in a nondestructive manner. Therefore, microelectronic devices can be tested during their fabrication process.

Figure 9:
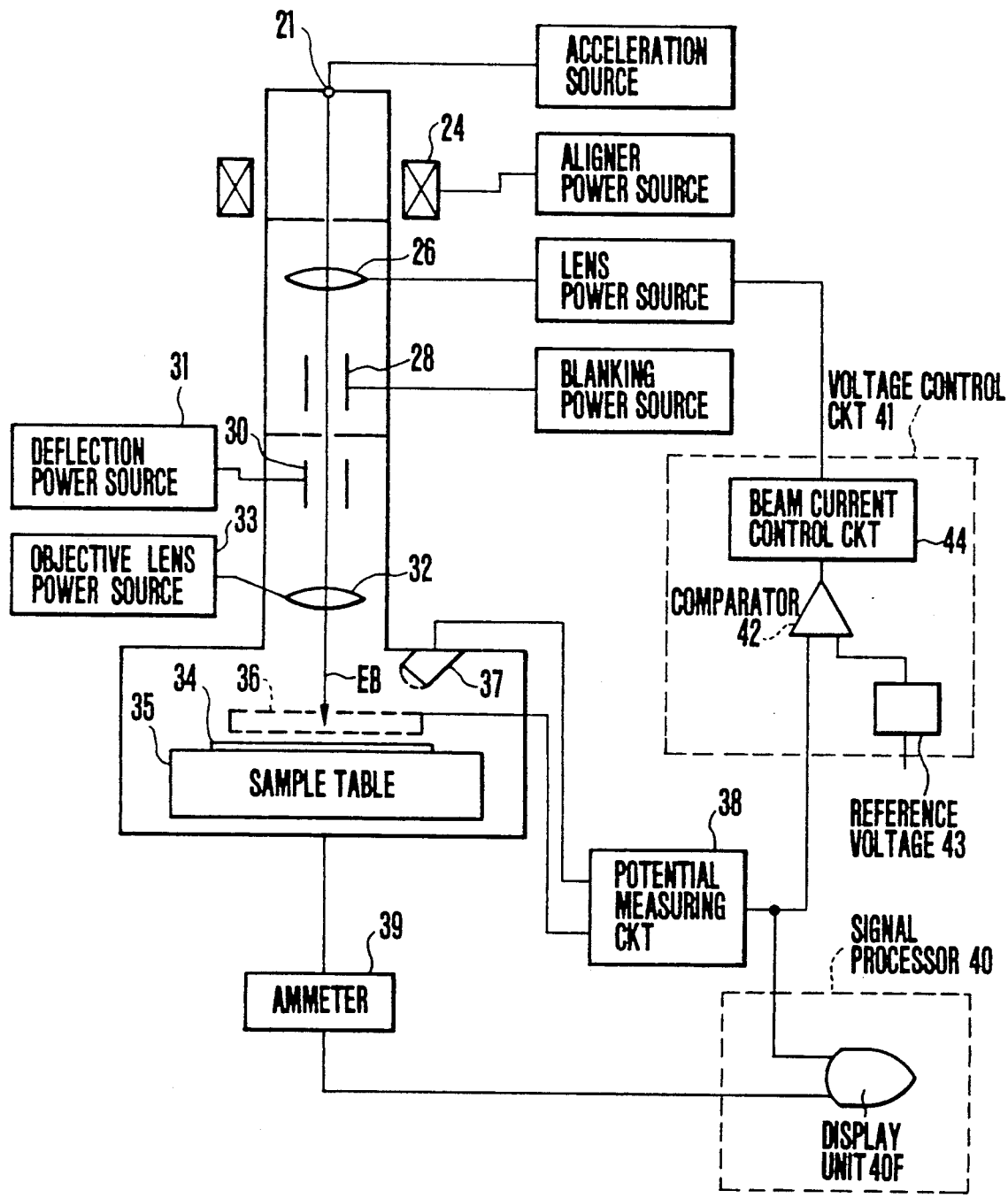
FIGS. 9, 10 and 11 are system block diagrams showing apparatuses for testing an integrated electronic device according to other embodiments of the present invention.
Figure 18:
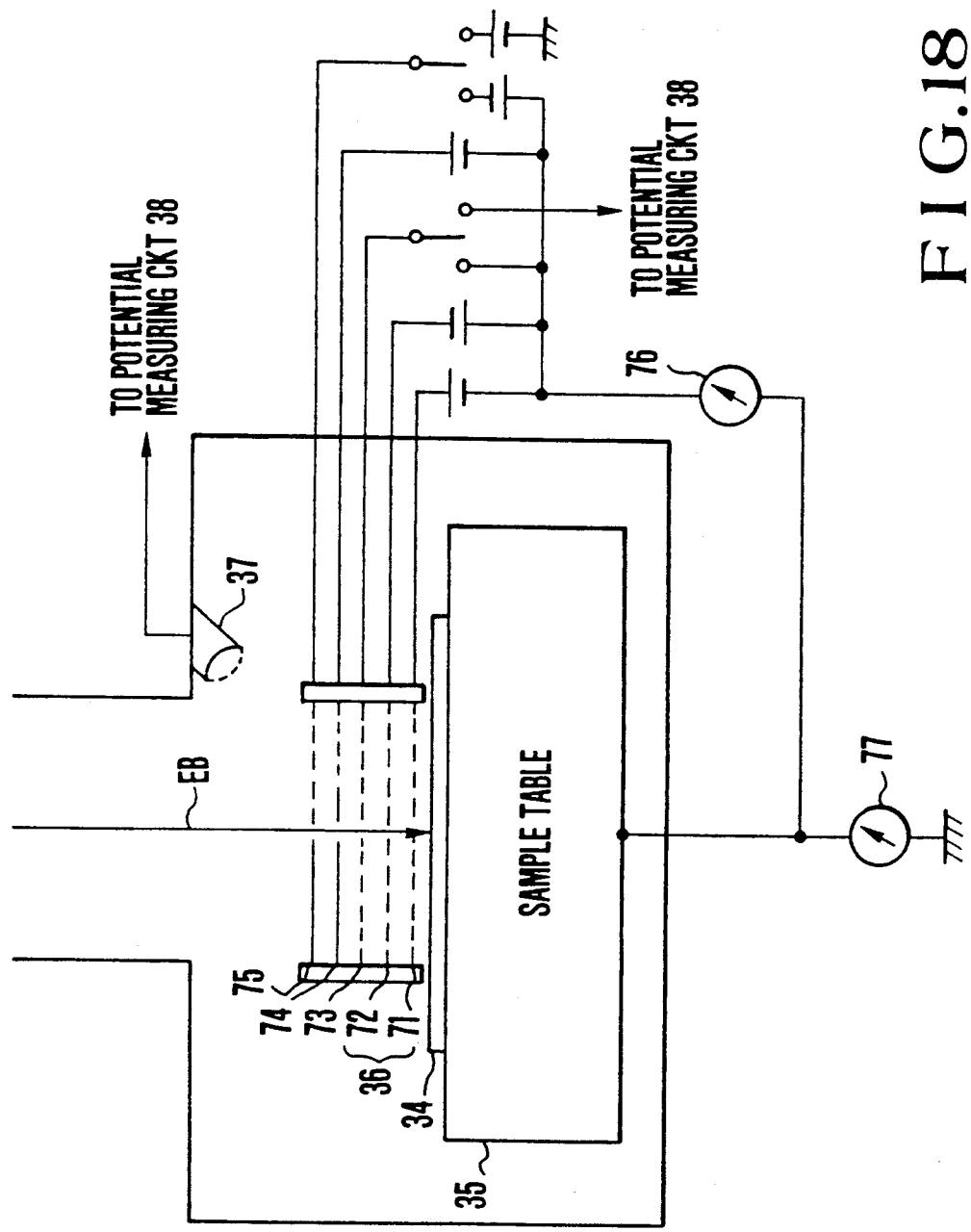

FIG. 9 shows an apparatus for testing an integrated electronic device according to another embodiment of the present invention. This embodiment shows a case wherein, in order to set a potential of a beam radiation point of the electronic device to a given value, an output from a potential measuring circuit 38 is supplied through a voltage control circuit 41 to a lens power source 27 for changing a primary charged beam current. The voltage control circuit 41 includes a comparator 42 for comparing a radiation point potential as an output from a potential measuring circuit 38 with a reference voltage source 43 serving as a reference for a voltage to be set, and a beam current control circuit 44 for controlling the lens power source 27 to increase/decrease the beam current in response to the output from the comparator 42. The same reference numerals in FIG. 9 denote the same parts as in FIG. 1. A measuring potential is set at a predetermined positive or negative value in accordance with a secondary electron emission ratio $\delta$. This embodiment is suitable for this purpose. In order to set the potential at a predetermined negative value, a negatively charged beam (electron beam) of an acceleration voltage for the secondary electron emission ratio $\delta > 1$ is used. However, in order to set the potential at a predetermined positive value, an electron beam of an acceleration voltage for the secondary electron emission ratio $\delta > 1$ or a positively charged beam is used. In this embodiment, in order to give a predetermined number of secondary electrons, i.e., in order to set the potential at a predetermined value, the lens power source 27 in the voltage control circuit 41 is adjusted to change the beam current. In order to positively charge the electronic device, the device is irradiated with a charged beam EB, and its potential is then increased. When the potential is increased to a desired value, the beam current is decreased to keep the potential at the desired value. A substrate or beam current is measured at the predetermined potential to measure gate or junction leakage components. The beam current can be measured using, e.g., a Faraday cup 46 shown in FIG. 17. Alternatively, a secondary electron detection electrode 74 and a secondary electron control electrode 75 are arranged, as shown in FIG. 18, to measure a beam current in accordance with a sum of current components supplied through the electrodes 74 and 75 and the sample table 35. This latter method can be conveniently used since the sample table 35 need not be performed for every beam current measurement.

For illustrative convenience, as shown in FIG. 9, in a signal processor 40, there is illustrated only a display unit 40F for receiving outputs from the potential measuring circuit 38 and the ammeter 39, and displaying substrate current-potential characteristics.

Figure 10:
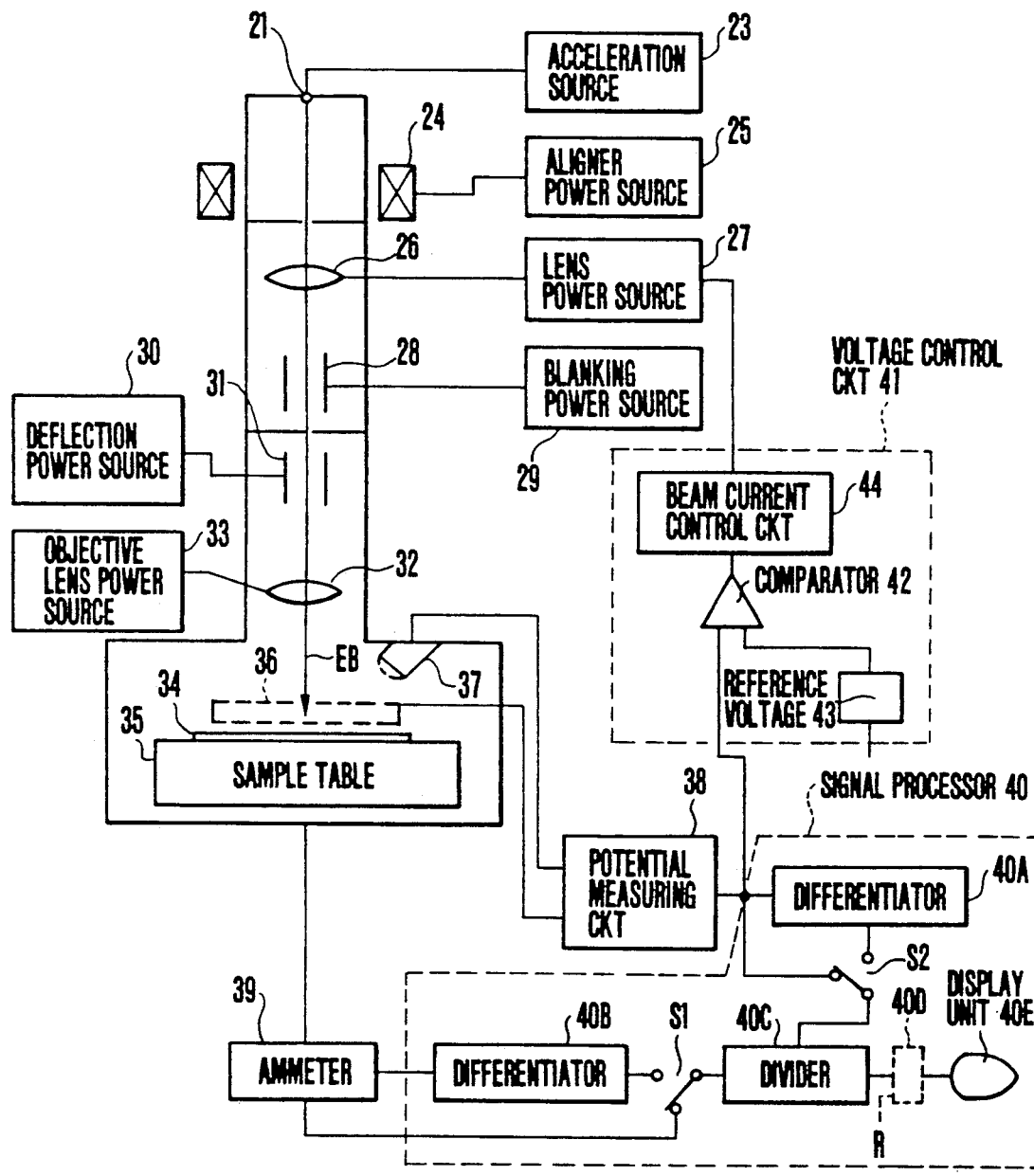

FIG. 10 shows another embodiment of the present invention in which a signal processor 40 is obtained by arranging the signal processor 40 of FIG. 9 on the basis of the signal processor 40 of FIG. 1. An output from a potential measuring circuit 38 is supplied to a voltage control circuit 41 to control a lens power source 27, thereby setting a potential at a predetermined value.

In the arrangement of FIG. 10, changes in substrate current and potential as a function of time are detected by differentiators 40B and 40A. A substrate current or its differential signal, and a substrate potential or its differential signal are selected by switches S1 and S2. A ratio of substrate current to its potential or a substrate current differential signal to a substrate potential differential signal is calculated by a divider 40C. An electronic device 34 is determined as being good or defective in accordance with a magnitude of the output from the divider 40C. A differential amplifier 40D may be connected to the output of the divider 40C to compare a reference value with the output from the divider 40C. The electronic device 34 can be determined as being good or defective in accordance with the comparison result. Positions of the switches S1 and S2 are selected in accordance with the measurement items. For example, when a leakage measurement is to be performed, a ratio of a substrate potential to its current or a differential ratio thereof is used to determine if the electronic device 34 is good or defective. When the substrate potential is set at the predetermined value and leakage measurement is to be performed, a ratio of substrate potential to its current or a differential thereof is used to determine if the electronic device 34 is good or defective. In addition, in order to perform a capacitance measurement, a ratio of substrate current and a time differential of its potential is calculated. Furthermore, changes in substrate current, potential and capacitance as a function time, and their potential dependency can also be measured. The signal processor 40 can be replaced with a computer to perform the same operation as described above.

Figure 11:
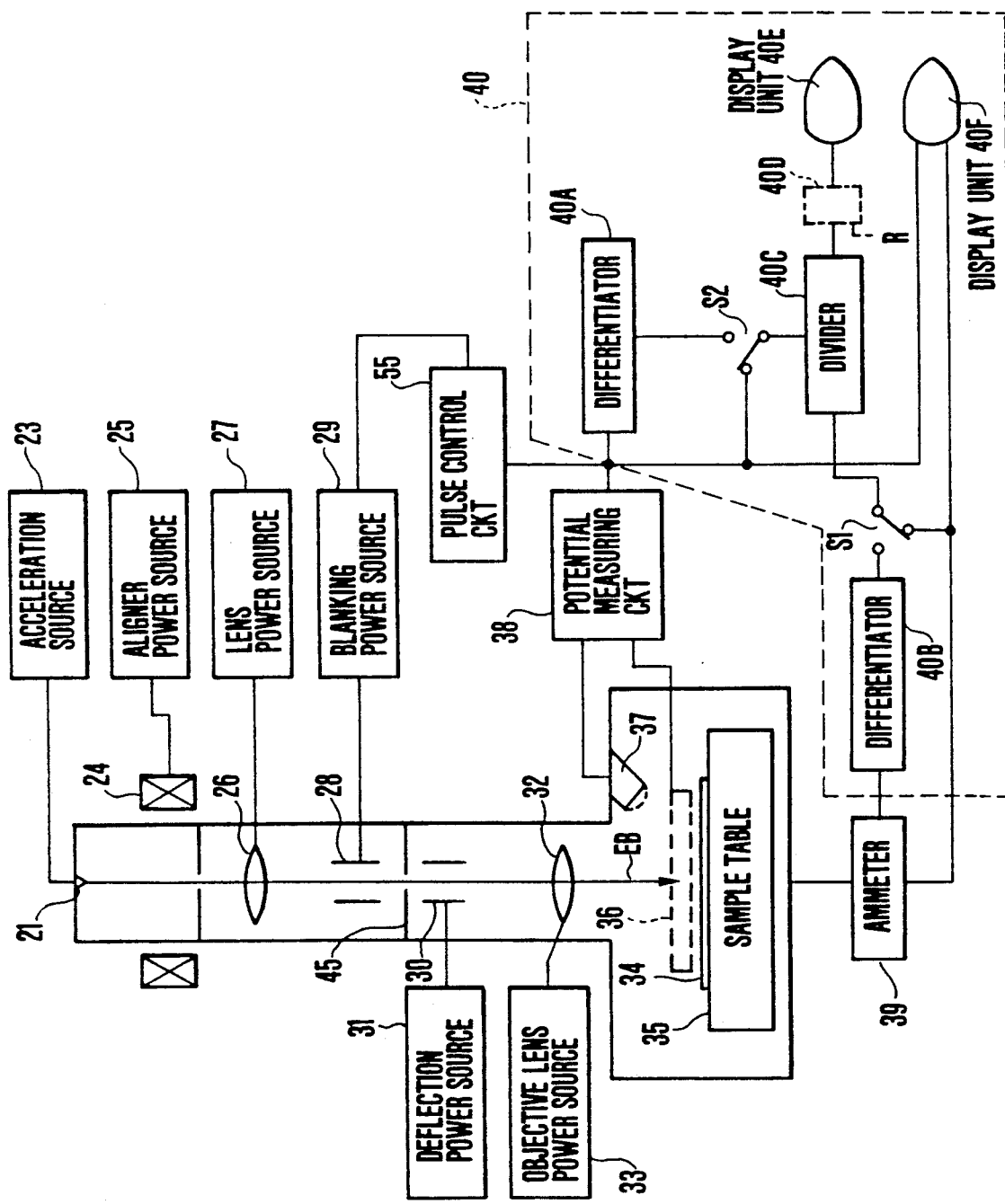

FIG. 11 shows an apparatus for testing an integrated electronic device according to still another embodiment of the present invention. A primary charged beam EB is a pulse beam obtained by chopping a signal from a pulse control circuit 55 through a blanker 28, a blanking power source 29, and a blanking aperture 45. In this apparatus, signals of the same phase for every pulse of the secondary electron signal are compared. An output from a potential measuring circuit 38 is fed back to the pulse control circuit 55 such that a difference in the comparison result is held constant, thereby changing the ON/OFF rate of the pulse beam. Other arrangements of FIG. 11 are the same as those of FIG. 9 or 10. In order to change the ON/OFF rate of the pulse beam EB, a pulse frequency is changed while a pulse width of the ON pulse beam is held constant, or a pulse width of the ON pulse is changed while its frequency is held constant; either technique can be used. With the above arrangement, the pulse beam can be held at a constant potential.

Figure 12:
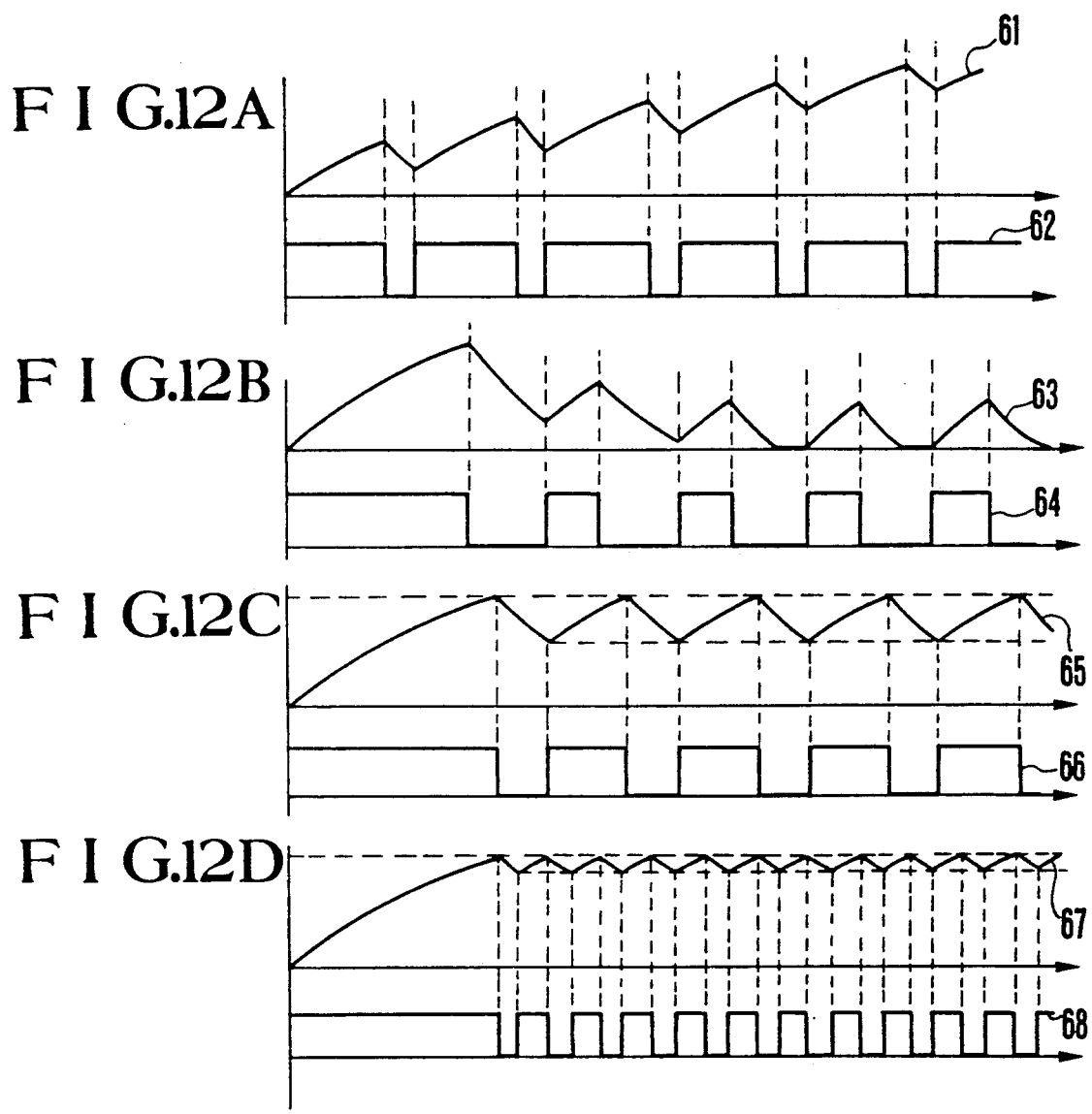
FIGS. 12A to 12D are timing charts for explaining the operation of the apparatus shown in FIG. 11.

FIGS. 12A to 12D are signals for setting the potential at a predetermined value in the apparatus of FIG. 11. FIGS. 12A to 12C show changes in potential when a pulse width of an ON pulse beam is changed while its frequency is held constant. Waveforms 62, 64, 66 and 68 show changes in beam current as a function of time and waveforms 61, 63, 65 and 67 show changes in potential as a function of time. FIGS. 12A to 12D show a case wherein a electronic device 34 is positively charged. The electronic device 34 is irradiated with an electron beam of an acceleration voltage for the secondary electron emission ratio $\delta > 1$, or a positively charged beam. When the pulse beam EB is radiated on the electronic device 34, a potential at the device 34 is increased during the ON period of the pulse beam EB, and decreased during the OFF period of the pulse beam EB. When the OFF period is short, the next pulse is generated before the beam pulse of the previous pulse is sufficiently discharged, and the potential of each pulse is increased, as shown in FIG. 12A. When the OFF state is long, the previous pulse is sufficiently discharged to decrease a change in potential, as shown in FIG. 12B. The potential is decreased to a given level or zero for every pulse. However, an ON/OFF ratio of a pulse beam EB for setting the potential to a predetermined value is changed when magnitudes of a capacitance and a gate leakage component of the radiation region are changed. Because of this, the ON/OFF ratio cannot be predetermined, and the potential must be detected by the secondary electron emission ratio $\delta$ in order to adjust the ON/OFF ratio of the pulse beam EB. As shown in FIG. 12C, the potential has a triangular wave with a constant peak. When a frequency is high, the potential becomes substantially constant, as shown in FIG. 12D. In order to set the potential to the predetermined value in this apparatus, the ON period of the pulse beam EB must be prolonged as compared with an electronic device with less gate leakage, since charges cannot be accumulated if there is a large gate leakage. The magnitude of the gate leakage can be identified by monitoring the ON/OFF ratio of the pulse beam when the potential is set at a given value.

Figure 13:
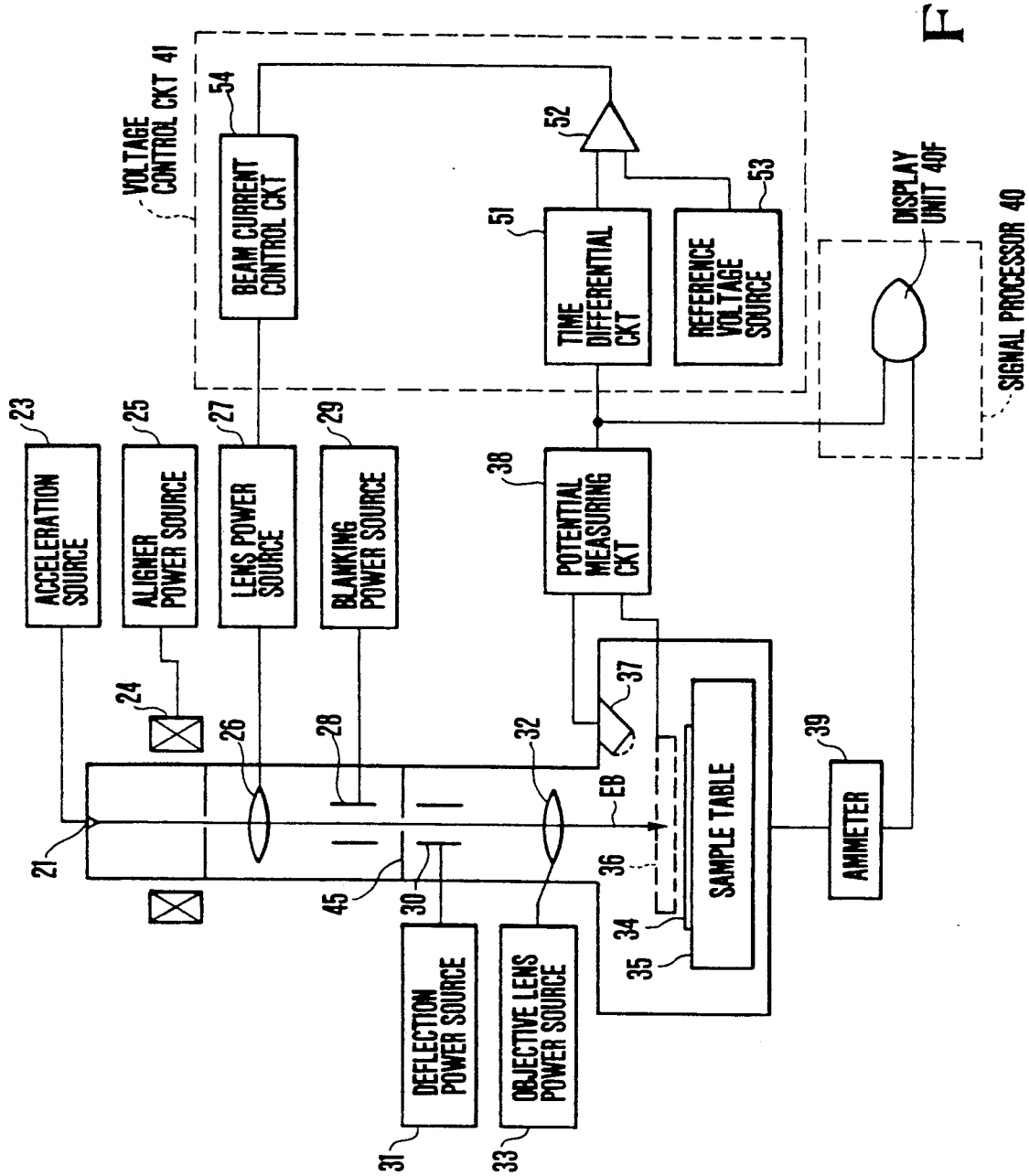
FIG. 13 is a system block diagram of an apparatus for testing an integrated electronic device according to still another embodiment of the present invention.

FIG. 13 shows an embodiment wherein a problem presented by the circuit arrangement of FIG. 1 is solved. More specifically, in the circuit arrangement of FIG. 2, the characteristics represented by the solid line in FIG. 6 are obtained. The broken line represents the measurement results using the conventional mechanical probe method. Characteristic curve a represents the substrate current-voltage characteristics of a defective electronic device with large leakage, and characteristic curves b and c represent substrate current-voltage characteristics of good electronic devices. The potential in the defective electronic device is not substantially increased from an intermediate point, while its substrate current is abruptly increased. In the good electronic devices, the substrate current is saturated or decreased after its peak. Therefore, measurement is performed in the devices represented by curves b and c while a current value of the electron beam is held constant. However, in the device represented by curve a, a voltage applied to the electrode is held constant. For this reason, the measured values of the substrate current vary in accordance with a measurement technique wherein a voltage or current is supplied to the electronic device. A large substrate current can be measured when a current is supplied to an electronic device.

The embodiment shown in FIG. 13 solves the above problem. In this embodiment, for the sake of simplicity, a signal processor 40 includes a display unit 40F. Outputs from a potential measuring circuit 38 and an ammeter 39 are supplied to the display unit 40F so that substrate current-potential characteristics are displayed thereon. The display unit 40F may be an X-Y recorder or an arrangement wherein changes in potential and current as a function of time are stored and the stored values are displayed on a CRT.

The section featuring the present invention will now be described. In the voltage control circuit 41 of FIG. 1, a potential is controlled on the basis of not the potential value but potential changes as a function of time. More specifically, an output from the potential measuring circuit 38 is supplied to a differential amplifier 52 through a time differentiator 51. The differential amplifier 52 calculates a difference between the output from the circuit 38 and an output from a reference voltage source 53. An output from the differential amplifier 52 is supplied to a beam current control circuit 54 as a control means. In order to control voltage changes as a function of time, a lens power source 27 is controlled by the beam current control circuit 54, thereby controlling the current of a primary charged beam.

The principle of operation of this test apparatus will be described below. A predetermined position on an electronic device 34 is irradiated with an electron beam EB. A voltage of the electronic device 34 and a substrate current are changed as a function of time upon radiation of the electron beam. When the electron beam is used as a primary charged beam, a secondary electron emission ratio $\delta$ is larger or smaller than 1 in accordance with the device material and the acceleration voltage. For example, if a metal electrode of a MOS capacitor is irradiated with the electron beam, the electrode is positively charged when an acceleration voltage of $\delta > 1$ is applied thereto. However, if $\delta < 1$, the electrode is negatively charged. When the electrode is not connected to external wiring, a potential at the electrode is changed as a function of time. In order to set a negative potential or its negative change, a negatively charged beam (electron beam) at an acceleration voltage of $\delta < 1$ is used. However, an electron beam at an acceleration voltage of $\delta > 1$ or a positively charged beam is used to positively charge the electrode.

When the electrode is irradiated with the charged beam with a constant current, the potential is exponentially saturated as a function of radiation time. In this test apparatus, in order to set potential changes as a function of time constant, but not the beam current constant, the potential change as a function of time is measured by the differentiator 51. When a measured value is smaller than a preset reference voltage, the voltage control circuit 41 controls the lens power source 27 to increase the beam current, and the operation is repeated. When the potential or the substrate current reaches a given value, beam radiation is stopped. Subsequently, a potential at the radiation region is measured by an energy analyzer 36 and the potential measuring circuit 38. At the same time, a substrate current is measured by the ammeter 39. As a result, the substrate current-potential characteristics are displayed on the display unit 40F in the signal processor 40.

Figure 14:
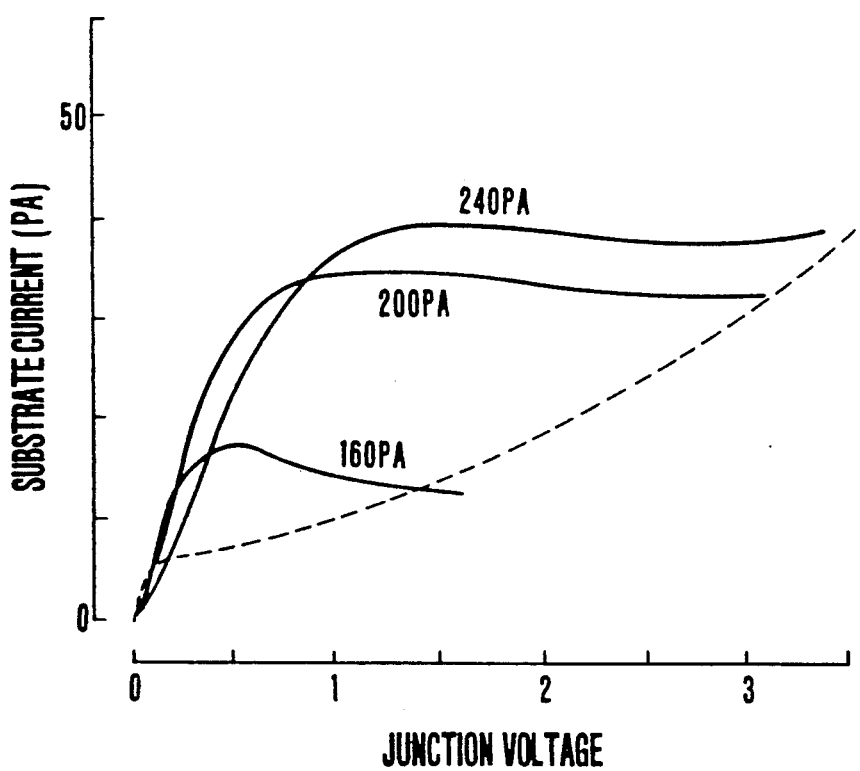
FIG. 14 is a graph showing changes in junction voltage and substrate current as a function of time when a p-n junction is irradiated with a charged beam at a constant beam current.

The effect of the test apparatus of this embodiment will be described. FIG. 14 is a graph showing changes in p-n junction voltage and substrate current by using the beam current as a parameter. The solid line represents nondestructive measurement with the electron beam, and the broken line represents contact measurement with the mechanical probe method Current values in FIG. 14 represent beam currents, namely, 160 pA, 200 pA and 240 pA. The solid line represents the measurement at a constant beam current. As compared with the case represented by the broken line wherein a voltage is supplied according to the mechanical probe method, a larger substrate current can be supplied during the transient response time immediately after the device has been irradiated with the beam. The substrate current-voltage characteristics for the nondestructive measurement with the beam gradually come closer to those for the contact measurement with probes.

Approximated values vary according to beam currents. When a large beam current is used, a higher substrate current is obtained However, the beam current is not proportional to the substrate current. In a normal electronic device, the substrate current is approximated to one point with respect to the beam current. In this case, the electronic device can be determined as being good or defective. However, the substrate current-potential characteristics represented by the broken line cannot be obtained. However, according to the test apparatus of the present invention, the beam current is gradually changed after the potential is saturated. Therefore, as shown in FIG. 15, the substrate current is approximated with respect to each beam current When the beam current is changed with high precision, the substrate current-potential characteristics like those in the contact measurement can be obtained nondestructively. Therefore, the electronic devices can be tested quantitatively. In this case, the output from the reference voltage source 53 is near zero.

The potential is set in the test apparatus in FIG. 13 in the following manner An output from the potential measuring circuit 38 is fed back to the lens power source 27 through the voltage control circuit 41. The lens power source 27 is adjusted to set the potential equal to the reference potential, thereby changing the beam current. Alternatively, the ON/OFF time of the pulse beam is controlled to set the potential. In this case, the ON time of the pulse beam is held constant while the pulse interval is changed, or the pulse interval is kept unchanged while the ON time of the pulse beam is changed. Either technique can be used.

When the potential changes as a function of time are held constant, the beam current or the ON/OFF time of the pulse beam can be controlled. When the beam current is excessively large, the potential changes as a function of time are abrupt. Thus, if the potential changes over time are larger than a preset value, the beam current is decreased. If the potential changes are smaller than the predetermined value, the beam current is increased. More specifically, the potential change as a function of time is detected by a differentiator 51. An output from the differentiator 51 is compared by a differential amplifier 52 with an output as the reference value from a reference voltage source 53. The beam current is increased/decreased in accordance with the polarity of the output from the differential amplifier 52. In other words, the beam current is increased or decreased in proportion to the output from the differential amplifier 52. In this case, when the beam current is immediately changed when the detected value is slightly deviated from the reference value, the potential finely oscillates. In order to prevent this, a predetermined adjustment margin is provided. When the output from the differential amplifier 52 exceeds a given value, the beam current is subjected to an increase or decrease. Otherwise, the beam current is not changed or is changed with a low rate.

This adjustment operation will be described with reference to FIGS. 16A and 16B. The alternate long and short dashed line in FIG. 16A represents potential changes as a function of time. In practice, the potential change range falls within the area defined by the broken lines. In this case, a positive potential slope is exemplified. However, a negative potential slope can be considered in the same manner as the positive potential slope.

FIG. 16A shows potential changes as a function of time, and FIG. 16B shows beam current changes as a function of time on the same time basis as the potential changes. In normal operation, the potential is saturated when the beam current is held constant. Potential changes as a function of time can be small. When the potential change is equal to the reference value (the broken line), the beam current is increased and the above operation is then repeated. Therefore, the beam current is set such that initial changes are small and then changes are increased. The time differential of the potential is compared with the reference value. Alternatively, the reference voltage can be increased at a constant rate as a function of radiation time and can be directly compared with the measured potential value. In the apparatus of FIG. 13, the differentiator 51 and the differential amplifier 52 are used. However, the measured potential may be input to a computer to calculate potential changes as a function of time. The beam current is then controlled in accordance with magnitudes of the potential changes.

A method of testing the above test apparatus will be described hereinafter. Changes in substrate current and potential as a function of time are measured to perform good/defective device discrimination and capacitance measurement. After the beam is positioned, an electronic device is irradiated with the beam. The substrate current and the potential are measured, and the substrate current-potential characteristics are output at an X-Y recorder. In this case, the potential changes as a function of time are detected by the differentiator. When this change comes to zero, the beam current is increased. In this case, the output from the reference voltage source 53 is set near zero voltage. This operation is repeated to increase the potential. When a substrate or beam current corresponding to a given potential is measured, gate and junction leakage measurement can be performed. An electronic device with large gate and junction leakage requires a larger beam current to obtain the same potential as that for an electronic device with smaller leakage. Leakage can be measured by detecting a beam current change for causing the same potential change from a given potential. The beam current measurement can be performed by an embodiment shown in FIG. 17 or 18. FIG. 17 shows the embodiment wherein a beam current is measured using the Faraday cup 46. A technique using the Faraday cup is known to those skilled in the art, and a detailed description thereof will be omitted.

FIG. 18 shows the embodiment showing beam current measurement. Referring to FIG. 18, reference numeral 71 denotes an extraction electrode; 72, a retarding electrode; and 73, an energy analysis electrode. The electrodes 71 to 73 constitute the energy analyzer. Reference numeral 74 denotes a secondary electron detection electrode; and 75, a secondary electron control electrode. A beam current is measured by an ammeter 77. A current of the secondary electrons is measured by the ammeter 76 and is divided by a beam current to obtain a secondary current emission ratio. At the time of potential measurement, two switches are set in the right positions, respectively. A positive voltage is applied to the secondary electron control electrode 75, and the secondary electrons are supplied to a secondary electron detector 37. A voltage at the energy analysis electrode 73 is supplied to a potential measuring circuit 38 to perform potential measurement. However, when a beam current or a secondary electron current is to be measured, a negative voltage is supplied to the secondary electron control electrode 75. The secondary electrons are held in the secondary electron control electrode 75 and then current measurement is performed.

When the embodiment of FIG. 17 is compared with that of FIG. 18, the embodiment of FIG. 18 is more convenient since sample table positioning need not be performed for every beam current measurement.

Figure 19:
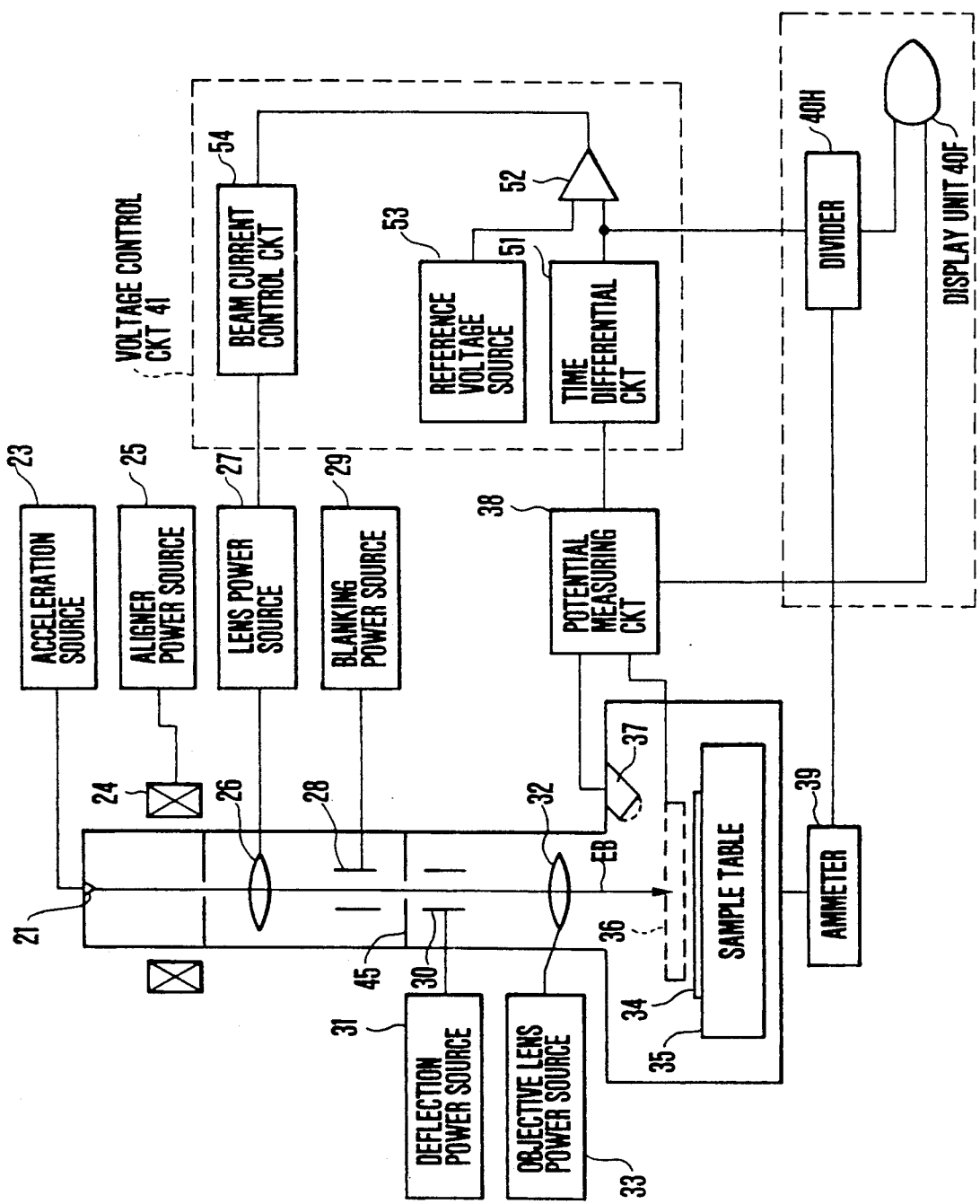

When a capacitance is to be measured, a test apparatus shown in FIG. 19 is used. The apparatus of FIG. 19 is substantially the same as that of FIG. 13, except that an output from a differentiator 51 connected to the output of a potential measuring circuit 38 and an output from an ammeter 39 for measuring a substrate current are supplied to a divider 40H in a signal processor 40, and a capacitance is measured in accordance with a ratio represented by the output from the divider 40H.

In this case, an output from a reference voltage source 53 is a value corresponding to a target potential change as a function of time. More specifically, changes in potential and substrate current as a function of time are measured, the substrate current I is changed such that the changes in potential V as a function of time are constant, and at the same time, a capacitance is calculated by $C(t) = I/(dV/dt)$. Therefore, the capacitance C or C-V plot can be displayed in accordance with the substrate current value and the output from the differentiator 51 connected to the output of the potential measuring circuit 38. In a method for calculating a capacitance by measuring changes in substrate current and potential as a function of time while the beam current is held constant, a large substrate current is supplied due to transient response immediately after the device is irradiated with the beam. Therefore, an apparent capacitance becomes large. The displayed C-V plot is different from the normal quasistatic C-V. However, if the measurement is performed by controlling the beam current such that the potential changes are constant, substantially the same characteristics as those by the contact measurement with the mechanical probe method can be obtained. In this case, the changes in potential and substrate current are measured to obtain the capacitance immediately after the electronic device is irradiated with the beam. However, changes in substrate current and potential as a function of time can be measured under the condition wherein the potentials are gradually decreased upon changes in beam radiation conditions after the potential is increased to a given value. Thereafter, the capacitance is calculated.

Figure 20:
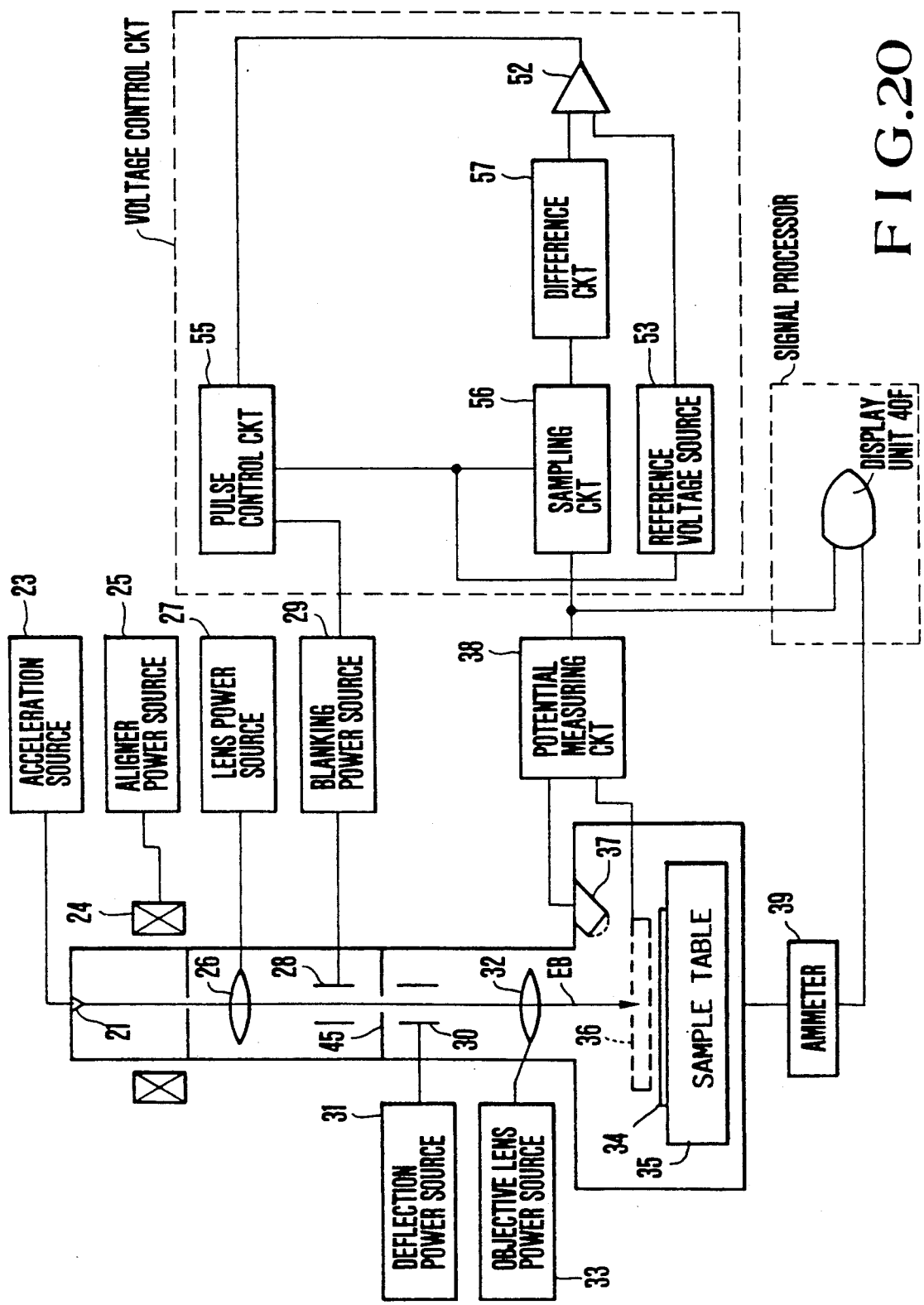

A measurement with a pulse beam will be described. FIG. 20 shows still another embodiment of the present invention, wherein a pulse beam is used as a beam source. A primary charged beam is chopped in response to a signal from a pulse control circuit 55 as a control means using a blanker 28, a blanking power source 29 and a blanking aperture 45, thereby generating a pulse beam. An electronic device is irradiated with the pulse beam. The secondary electron signals of the same phase from the electronic device are sampled in response to the output from the pulse control circuit 55 for the respective pulses to detect potential differences for respective pulses. The output from a potential measuring circuit 38 is fed back to the pulse control circuit 55 and the ON/OFF time of the pulse beam is changed such that the potential differences coincide with a reference value. A voltage control circuit in the test apparatus of this embodiment will be described below. An output from the potential measuring circuit 38 is supplied to a sampling circuit 56. The sampling circuit 56 detects voltages of the same phase for the respective pulses, and a difference circuit 57 connected to the output of the sampling circuit 56 calculates a potential difference. The output from the difference circuit 57 is supplied to a differential amplifier 52. An output from a reference voltage source 53 represents the reference value for the potential change as a function of time. This reference value is inversely proportional to the pulse intervals. The reference value is set in response to the output from the pulse control circuit 55. In this case, the ON/OFF period of the beam is not controlled. Therefore, the voltage control circuit does not control the lens power source but the blanking power source. Other arrangements of FIG. 20 are the same as those of FIG. 13 or 19.

The beam current has a large current value for increasing the potential higher than the reference potential when the potential is negatively changed, a small potential change occurs) when the electronic device is irradiated with a continuous beam (not a pulse beam). When the device is irradiated with the pulse beam, the potential during the ON period of the beam is increased. However, the potential is decreased during the OFF period of the beam. When the OFF period is long, the previous beam pulse is discharged before the next pulse is applied, and only a small change in potential is caused. Therefore, the potential is decreased to a given level or zero for every beam pulse. However, when the OFF period is short, the next beam pulse is generated before the previous beam pulse is sufficiently discharged. Therefore, the potential is increased for every beam pulse. The potential rise rate is increased when the pulse ON period is long. When a potential is detected for every pulse and a potential difference between the pulses is larger than the reference value, the ON period is shortened, i.e., the OFF period is prolonged. However, when the potential is lower than the reference value, the ON period is prolonged, i.e., the OFF period is shortened.

When potential changes as a function of time are set using the pulse beam, no charging is performed with a large gate leakage. In an electronic device with large leakage, the ON period of the pulse beam must be prolonged as compared with an electronic device with small leakage. Therefore, by monitoring the ON/OFF period of the pulse beam for setting the potential at a predetermined value, the magnitude of the gate leakage can be identified, thereby determining the device as a good or defective device.

In the above embodiments, the signal processors 40 may be replaced with a computer. In this case, a ROM must store programs including necessary measurement steps, and various measurement steps can be performed in accordance with the programs stored in the ROM. It should be noted that a general-purpose computer can be used to perform such measurement. A detailed arrangement of the computer is not illustrated but includes a central processing unit (CPU) incorporating a timer, a register, a pointer and the like, a random access memory (RAM) and a read only memory (ROM) for storing the above programs.

The function of the voltage control circuit can also be replaced with the computer The output from the secondary electron detector or the potential measuring circuit can be converted by an A/D converter, and a value of the lens or blanking power source can be set by the computer through a D/A converter.

Tests employing the present invention and performed under the control of a computer will be described with reference to FIGS. 21 to 30.

Substrate Current-Potential Characteristic Measurement I

Figure 21:
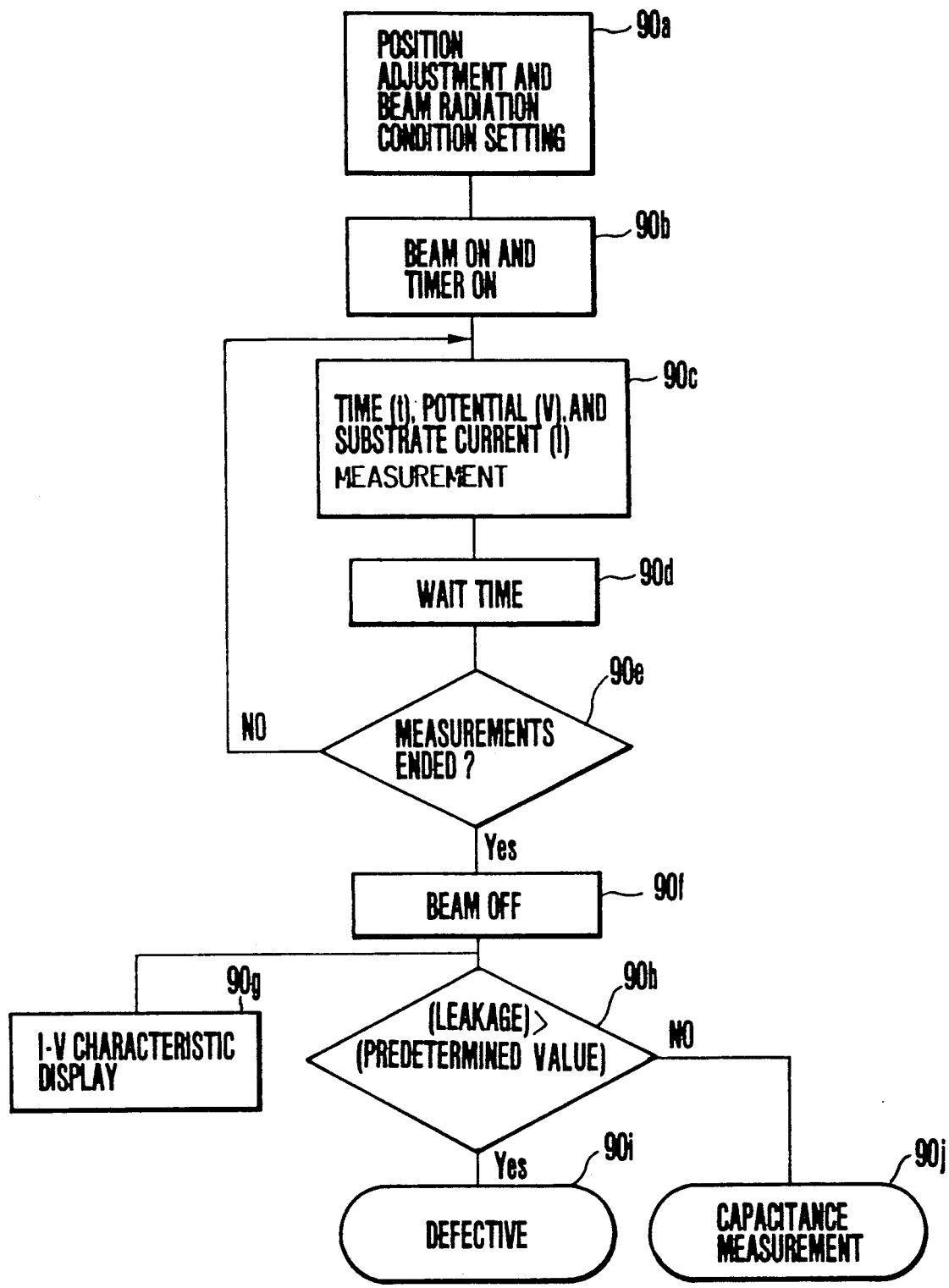

FIG. 21 is a flow chart for explaining a measurement of substrate current-potential characteristics of an electronic device to be measured. In step 90a, the primary charged beam is aligned in position, and beam radiation conditions are set. The beam radiation conditions include a beam current, and an acceleration voltage which change the secondary electron emission ratio. In step 90b, the electronic device is irradiated with the primary charged beam, and a soft timer is started. In step 90c, a time t, a substrate current I and an electrode potential V are measured for every wait time (step 90d), i.e., at predetermined time intervals, and the measured values are stored in the RAM. The predetermined time intervals may be constant or variable. The CPU checks in step 90e if all measurement is completed. If YES in step 90e, the flow advances to step 90f wherein the primary charged beam and timer are stopped. The affirmative determination in step 90e is based on one of the following conditions (1) when a time reaches a predetermined time, (2) when the potential is saturated, (3) when the potential reaches a given value, (4) when the substrate current reaches a given value, and (5) when the substrate current is saturated. If none of conditions (1) to (5) are satisfied, the flow returns to step 90c. The CPU then checks if measurement of the time t, the potential V and the substrate current I is completed. In step 90g, I-V characteristics are displayed on the display unit in accordance with the measured values. If necessary, the CPU checks in step 90h if leakage exceeds a predetermined value. If YES in step 90h, the electronic device is determined as a defective device in step 90i. However, if NO in step 90h, a capacitance measurement (to be described later) is performed in step 90j. The CPU determines if the leakage exceeds the predetermined value in accordance with a substrate current or potential value after a predetermined period of time, a substrate current value at a given potential, or a saturation value of V or I.

Substrate Current-Potential Characteristic Measurement II

Figure 22:
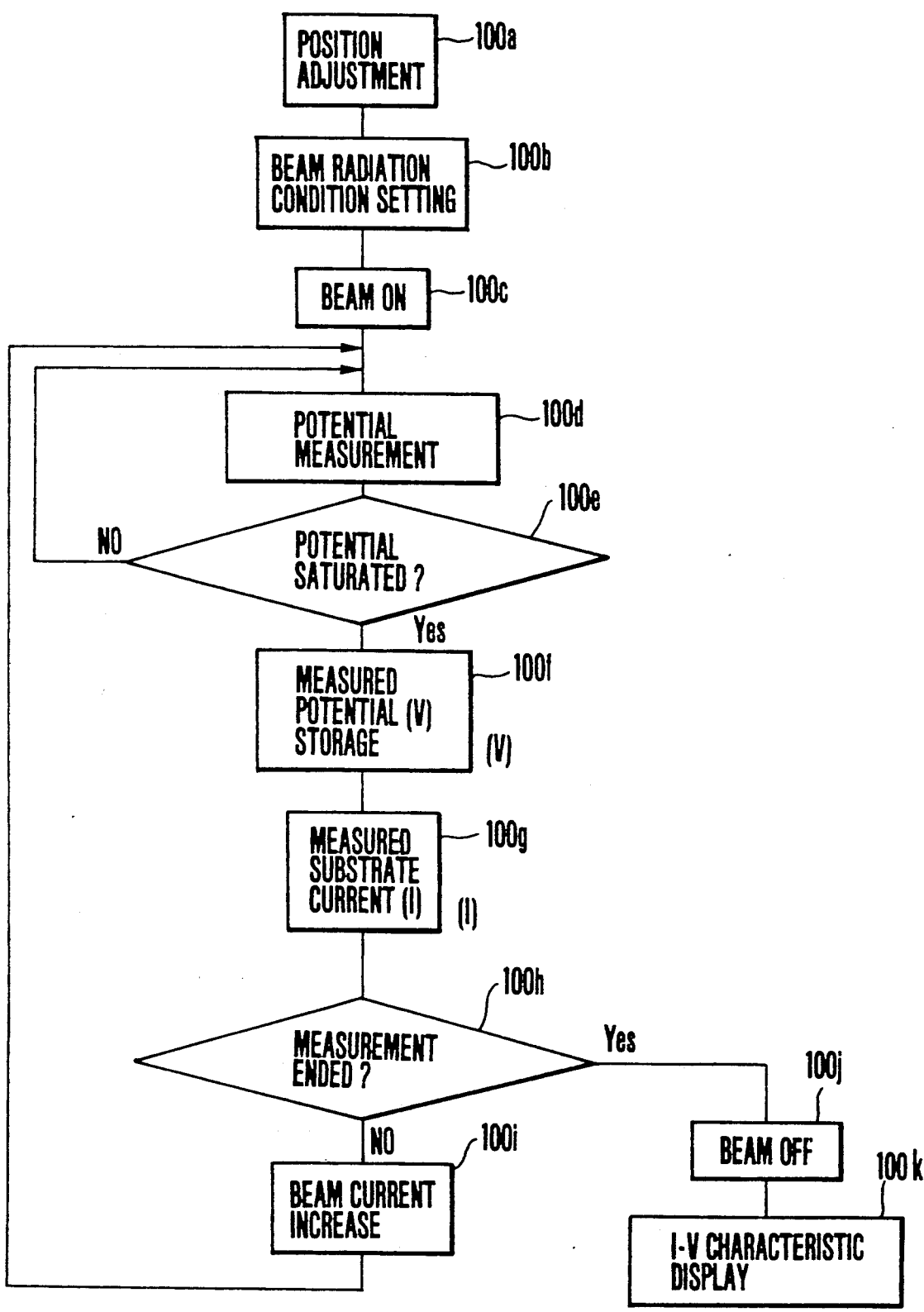

FIG. 21 shows the case wherein the beam current is held constant. However, if the saturation values of potential are sequentially changed to increase the beam current, processing must be performed, as shown in FIG. 22.

In step 100a, a beam position is adjusted. In step 100b, beam condition setting processing associated with an acceleration voltage is performed. In step 100c, an electronic device is irradiated with the beam. In step 100d, a potential is measured at a given beam current. This potential measurement continues via step 100e until the potential is saturated.

The CPU checks in step 100e if the potential is saturated. If YES in step 100e, the measured potential value is stored in the RAM in step 100f. Subsequently, a substate current I is measured and stored in the RAM in step 100g.

If further measurement must be made upon an increase of a beam current, the beam current is increased in step 100i via step 100h. The operations after step 100d are repeated.

If YES in step 100h, the beam current is turned off in step 100m. The I-V characteristics are displayed in accordance with the measured values in step 100d.

In the above measurement, the beam current is increased. However, measurement may be first made at a large beam current and then at decreased beam currents. Beam radiation condition setting in step 100b may be performed prior to position adjustment in step 100a. This can also be applied to the subsequent measurements.

Substrate Current-Potential Measurement III

Figure 23:
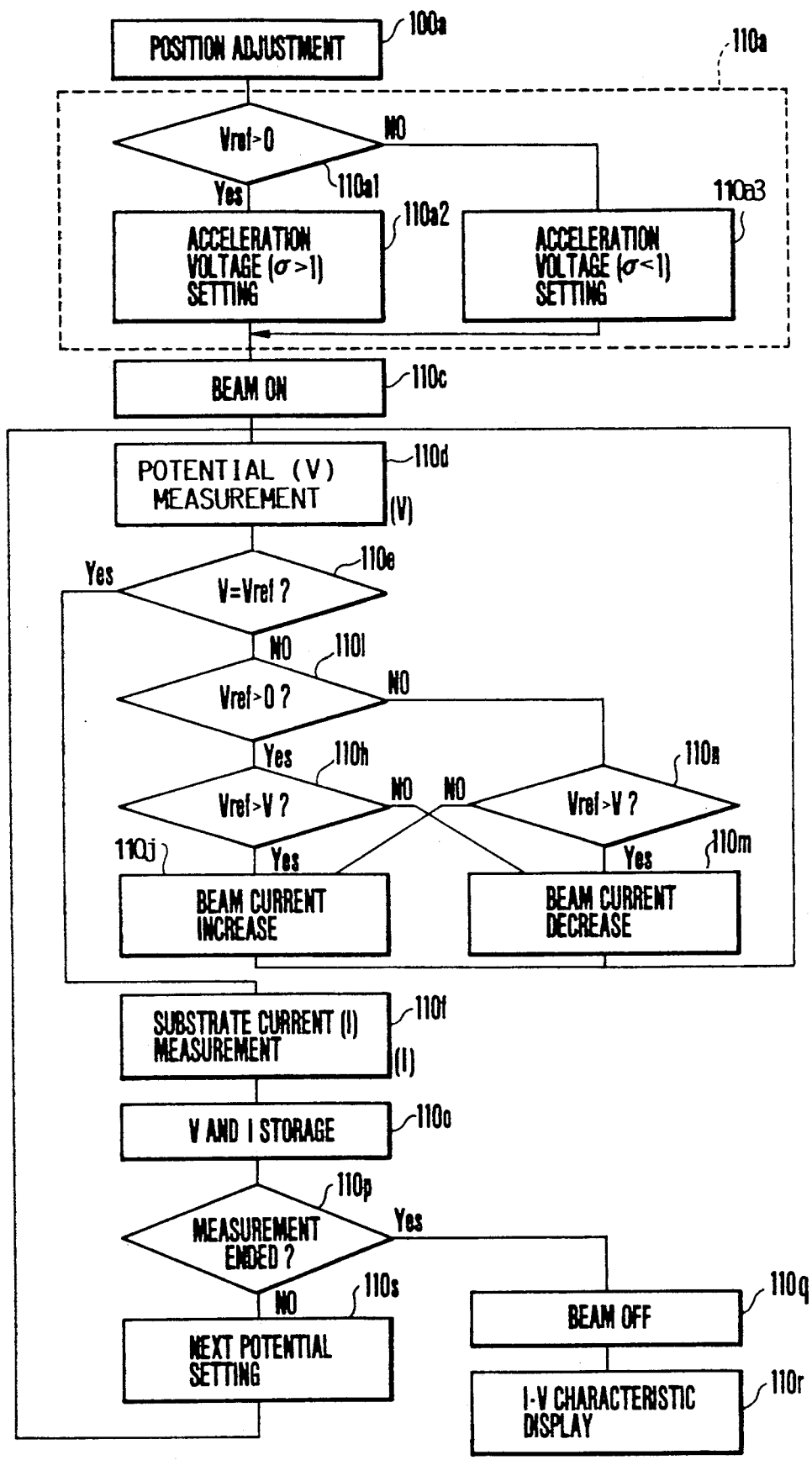

FIG. 23 shows still another modification of the substrate current-potential characteristic measurement. In this measurement, the beam current is controlled while potential measurement continues, and a leak current is measured to cause the measured potential to equal the reference value. In step 100a, the beam position is adjusted. In step 110a, beam radiation conditions are set. More specifically, the CPU checks in step 110a1 if the reference value Vref is larger than 0. If YES in step 110a1, an acceleration voltage of $\delta > 1$ is set in step 110a2. If NO in step 110a1, an acceleration voltage of $\delta < 1$ is set in step 110a3.

In step 110c, the primary charged beam is turned on. In step 110d, potential measurement is performed. The CPU then checks in step 110e if the measured potential is equal to the reference value. If YES in step 110e, a substrate current is measured in step 110f. However, if NO in step 110e, the flow advances to step 110i. The CPU checks in this step if the reference value Vref is larger than 0. If YES in step 110, the flow advances to step 110h. The CPU checks in step 110h if the reference value Vref is larger than the measured value V. If YES in step 110h, the beam current is increased in step 110j. However, if NO in step 110h, the beam current is decreased in step 110m.

However, if NO in step 110i, the flow advances to step 110n. The same operation as in step 110h is repeatedly performed. If YES in step 110n, the beam current is decreased in step 110m. However, if NO in step 110n, the beam current is increased in step 110j. When the operations in steps 110j and 110m are completed, the flow returns to step 110d. Therefore, the potential can be held constant by controlling the beam current.

After the substrate current I is measured in step 110f, the measured values V and I are stored in the RAM in step 110o. The CPU then checks in step 110p if all operations are completed. If YES in step 110p, the beam current is turned off in step 110q, and the I-V characteristics are displayed in step 110r. However, if NO in step 110p, the next potential value is designated in step 110s, and the flow returns to step 110d.

Good/Defective Electronic Device Discrimination I

FIG. 24 shows a case wherein an electronic device is discriminated as a good or defective device in accordance with the magnitude of gate or junction leakage of paired transistors or transistor logics incorporated in an electronic device. In step 120a, a beam position is adjusted. In step 120b, beam radiation conditions associated with the secondary electron emission ratio are set in the same manner as in step 110a of FIG. 11. In step 120c, the electronic device is irradiated with the charged beam.

In step 120d, a potential is measured. The CPU checks in step 120e if a measured potential V is equal to the reference value Vref. If NO in step 120e, the flow step 100b, returns to step 120d, and the potential is measured again.

If YES in step 120e, the flow advances to step 120f. The CPU may check in step 120e if the potential is saturated.

In step 120f, a substrate current is measured. In step 120g, the charge beam is stopped. It should be noted that the measured values are stored in the RAM according to a known technique.

The substrate current is compared with a standard value in step 120h to determine if the measured substrate current is smaller than the standard current. If YES in step 120h, the electronic device is determined to be a good device. However, if NO in step 120h, the electronic device is determined to be a defective device. The standard value is given on the basis of a measured value of a good device or a simulation result of a computer. The beam current is held constant in the gate leakage measurement for determining a good or defective device.

Good/Defective Electronic Device Discrimination II

Figure 25:
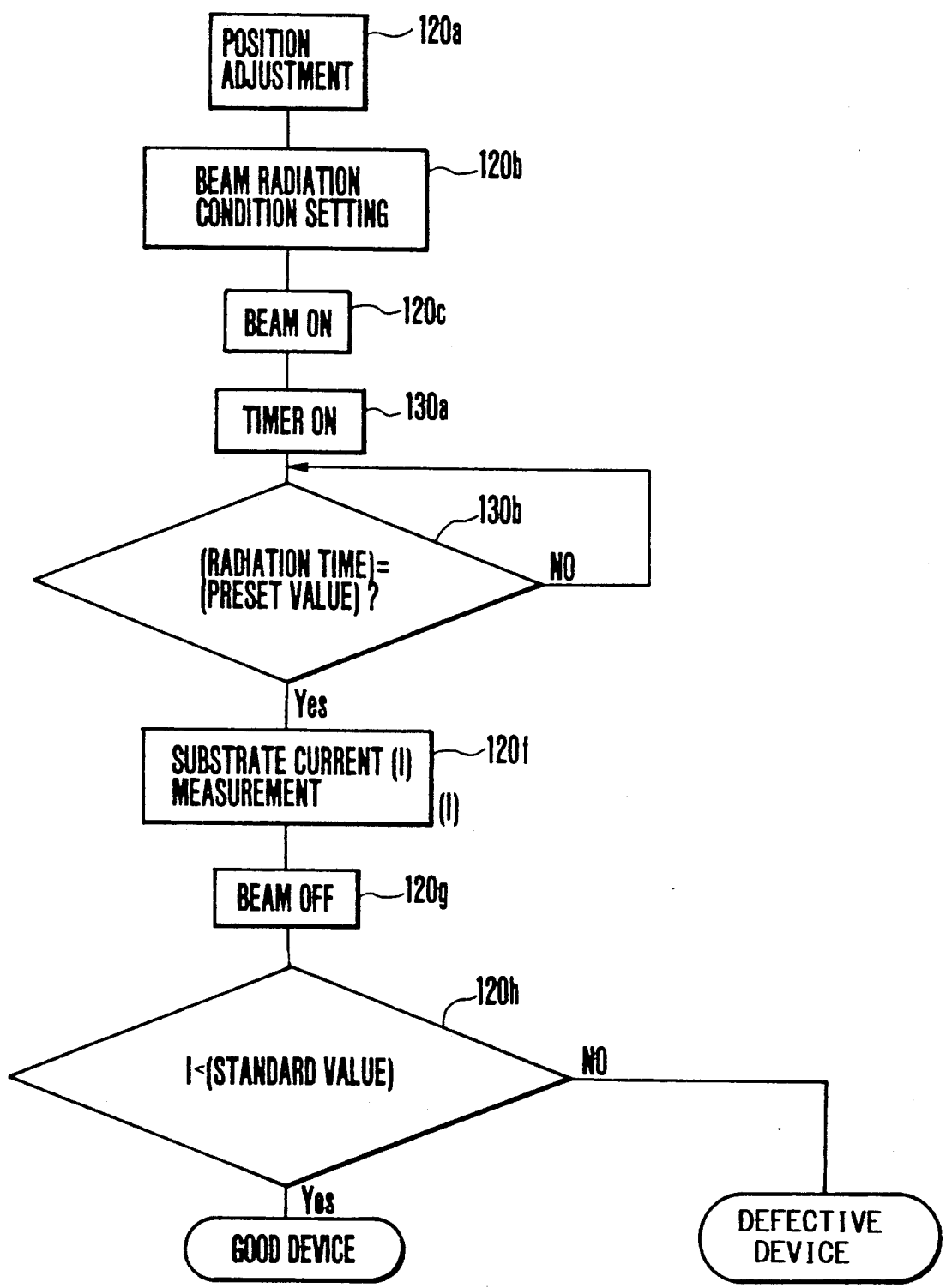

FIG. 25 shows another processing for discriminating an electronic device as a good or defective device according to its gate or junction leakage. In the same manner as in FIG. 24, beam position adjustment and beam radiation condition setting are performed in steps 120a and 120b, respectively. The electronic device is irradiated with the charged beam in step 120c. The timer is then turned on in step 130a. The CPU checks in step 130b if a beam radiation time reaches a reference or preset value. If NO in step 130b, the flow returns to step 130a. However, if YES in step 130b, the flow advances to step 120f, and a substrate current is measured. The following steps 120f, 120g and 120h are the same as those of FIG. 24.

Good/Defective Electronic Device Discrimination III

Figure 26:
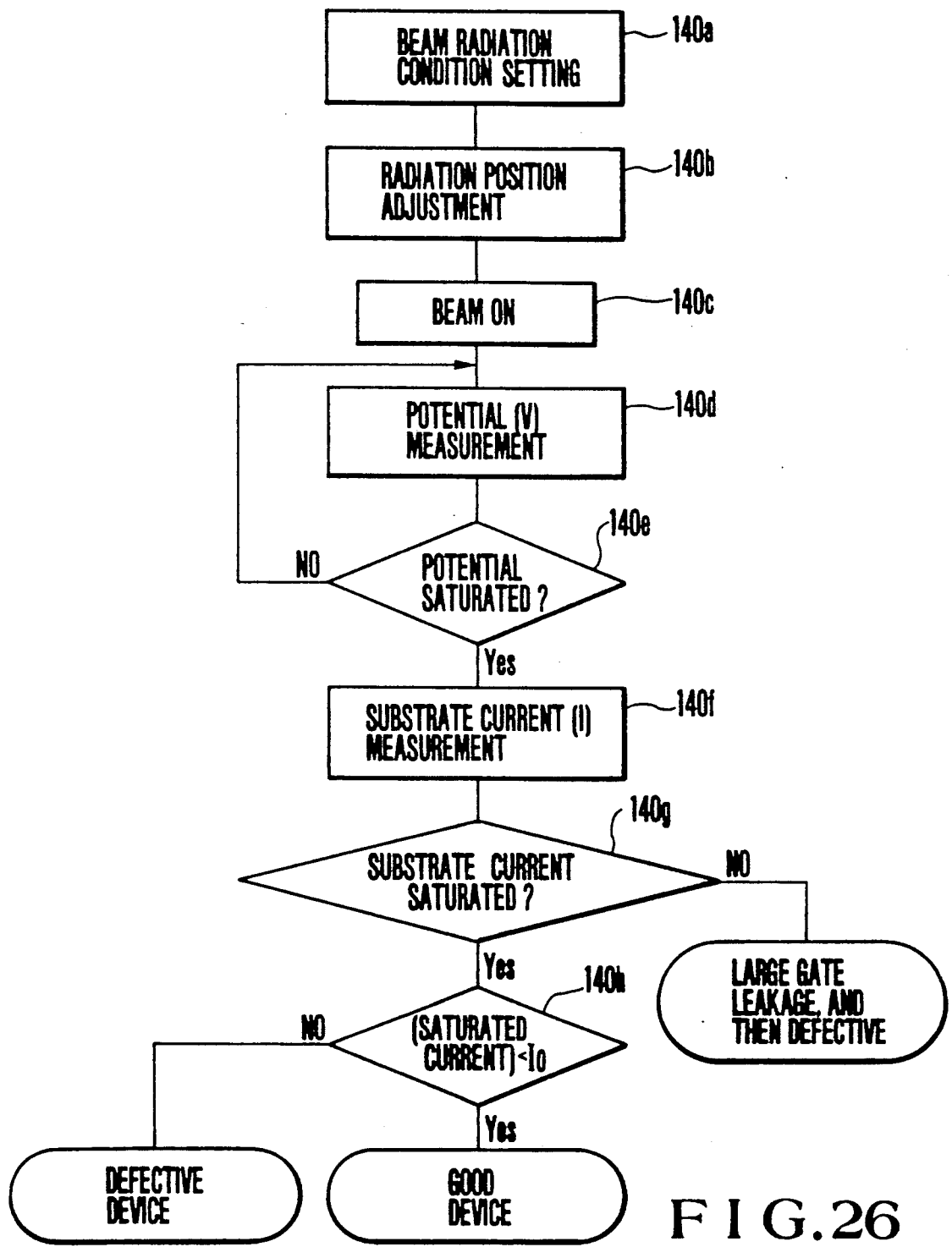

FIG. 26 shows still another processing for discriminating an electronic device as a good or defective device wherein a magnitude of leakage is discriminated by a magnitude of a saturated substrate current. In step 140a, beam radiation conditions are set. In step 140b, a beam position is then adjusted In step 140c, the device is irradiated with the charged beam. In steps 140d and 140e, potential measurement continues until the potential is saturated. When the potential is saturated, a substrate current is measured in step 140f.

However, if the substrate current is not saturated, the CPU determines that the gate leakage is large and the device is regarded as a defective device.

If the substrate current is saturated, the flow advances to step 140h. The CPU checks if the saturated current is larger than a reference value. If NO in step 140h, the CPU determines that the device is a defective device. However, if YES in step 140h, the CPU determines that the device is a good device.

Good/Defective Electronic Device Discrimination IV

Figure 27:
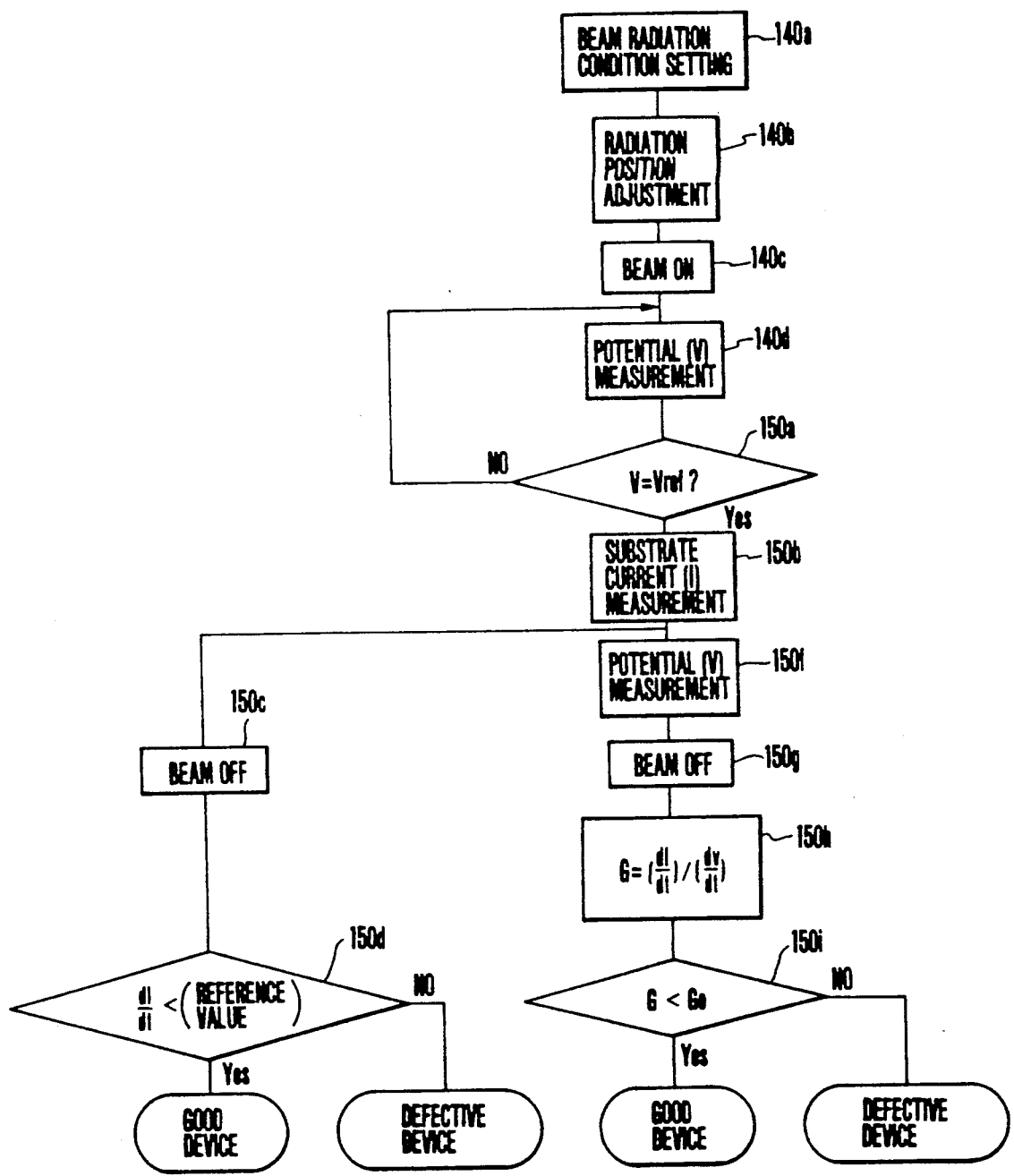

FIG. 27 shows still another processing for discriminating an electronic device as a good or defective device according to substrate current changes (dI/dt) as a function of time or a ratio (dI/dV) of substrate current change to potential change at a given potential. Beam radiation condition setting, radiation position adjustment, beam-ON operation and potential measurement are performed in the same manner as in steps 140a to 140d of FIG. 14. In step 140d, a potential is measured.

The CPU checks in step 150a if a measured potential V reaches the reference value. If NO in step 150a, the potential is measured again. However, if YES in step 150a, the flow advances to step 150b. In step 150b, dI/dt is calculated. In step 150c, the beam is stopped. The CPU checks in step 150d if dI/dt is smaller than a reference value. If YES in step 150d, the device is determined as a good device. However, if NO in step 150d, the device is determined as a defective device. After dI/dt is calculated in step 150b, dV/dt is measured in step 150f. In step 150g, the beam is stopped. In step 150h, G=(dI/dt)/(dV/dt)=dI/dV is calculated. This quotient is a reference value when the measured potential is equal to the reference potential. The calculated G value is compared with a reference value Go in step 150i. If G<Go, the device is determined as a good device. Otherwise, the device is determined as a defective device. When this discrimination method is used and leakage of a MOS capacitor is to be measured, (dI/dt)/V is calculated and then compared with a reference value to determine the device as a good or defective device.

Good/Defective Electronic Device Discrimination V

Figure 28:
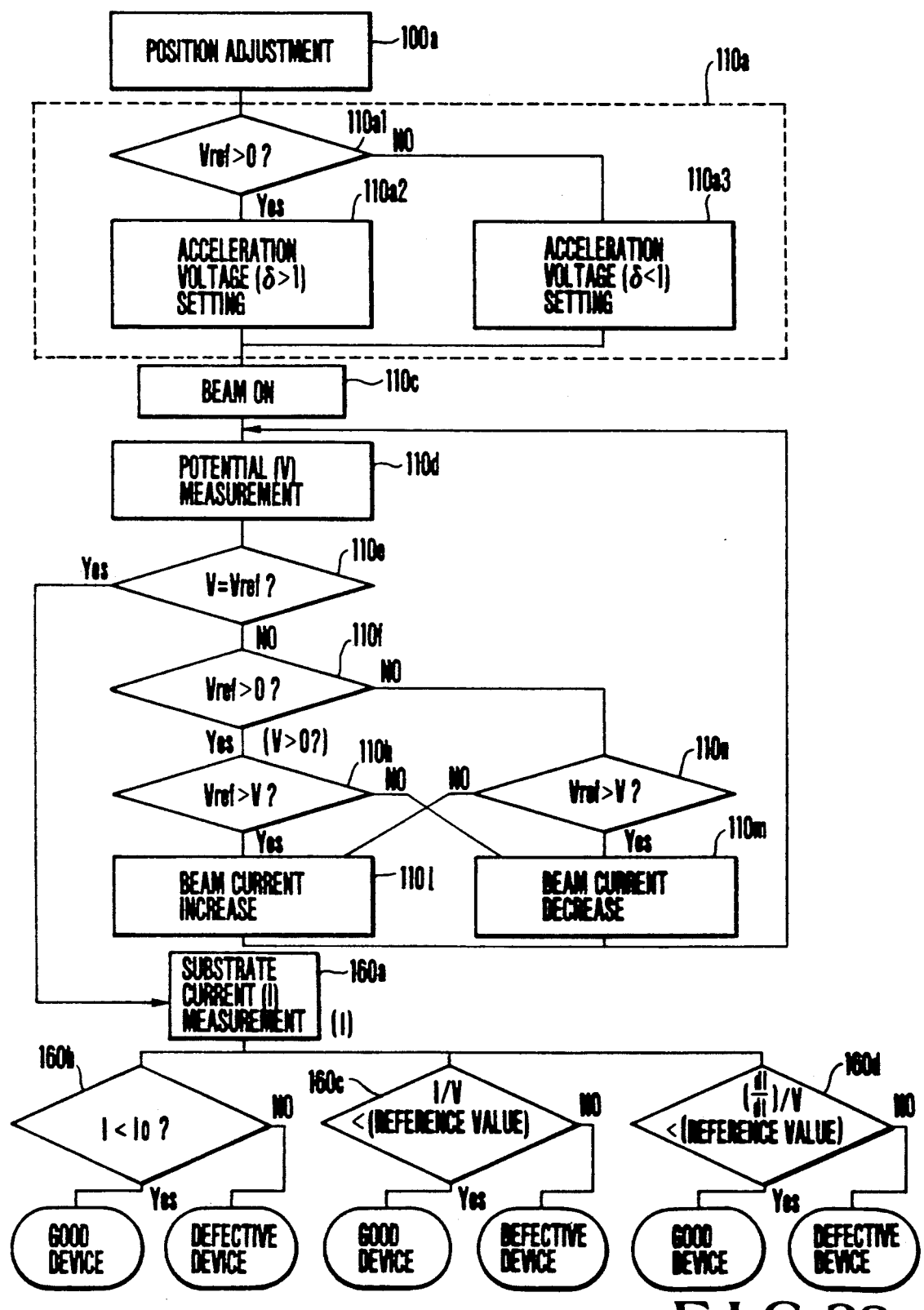

FIG. 28 shows still another processing for discriminating an electronic device as a good or defective device. More specifically, according to this processing, a beam current is controlled to cause a potential to equal the reference value, and the device is discriminated as a good or defective device according to a substrate current value at the reference value. Beam position adjustment and beam radiation condition setting are performed in the same manner as in steps 100a and 110a of FIG. 23. Beam radiation, potential measurement and beam current increase/decrease operation after processing of step 110a are the same as steps 110c to 110n. A detailed description of these operations will be omitted.

In step 110e, if the potential is equal to the preset value, the flow advances to step 160a to measure a substrate current I.

The CPU checks in step 160b if the measured substrate current I is smaller than the reference value Io. If I<Io, the device is determined as a good device. Otherwise, the device is determined as a defective device.

After the substrate current is measured in step 160a, the CPU checks in step 160c if I/V <(reference value) is established. If YES in step 160c, the device is determined as a good device. Otherwise, the device is determined as a defective device.

After step 160a, the CPU checks in step 160d if (dI/dt)/V <(reference value) is established. If YES in step 160d, the device is determined as a good device. Otherwise, the device is determined as a defective device.

Any one of the decision blocks 160b, 160c and 160d can be used. Alternatively, in step 160a of FIG. 28, a beam current can be measured in place of a substrate current, and the measured beam current can be compared with the reference value in the same manner as in step 160b or 160c, thereby determining the device as a good or defective device.

The potential is set at a predetermined value by changing the beam current. However, the ON/OFF period of the pulse beam can be controlled to set the potential at the predetermined value.

Capacitance Measurement I

Figure 29:
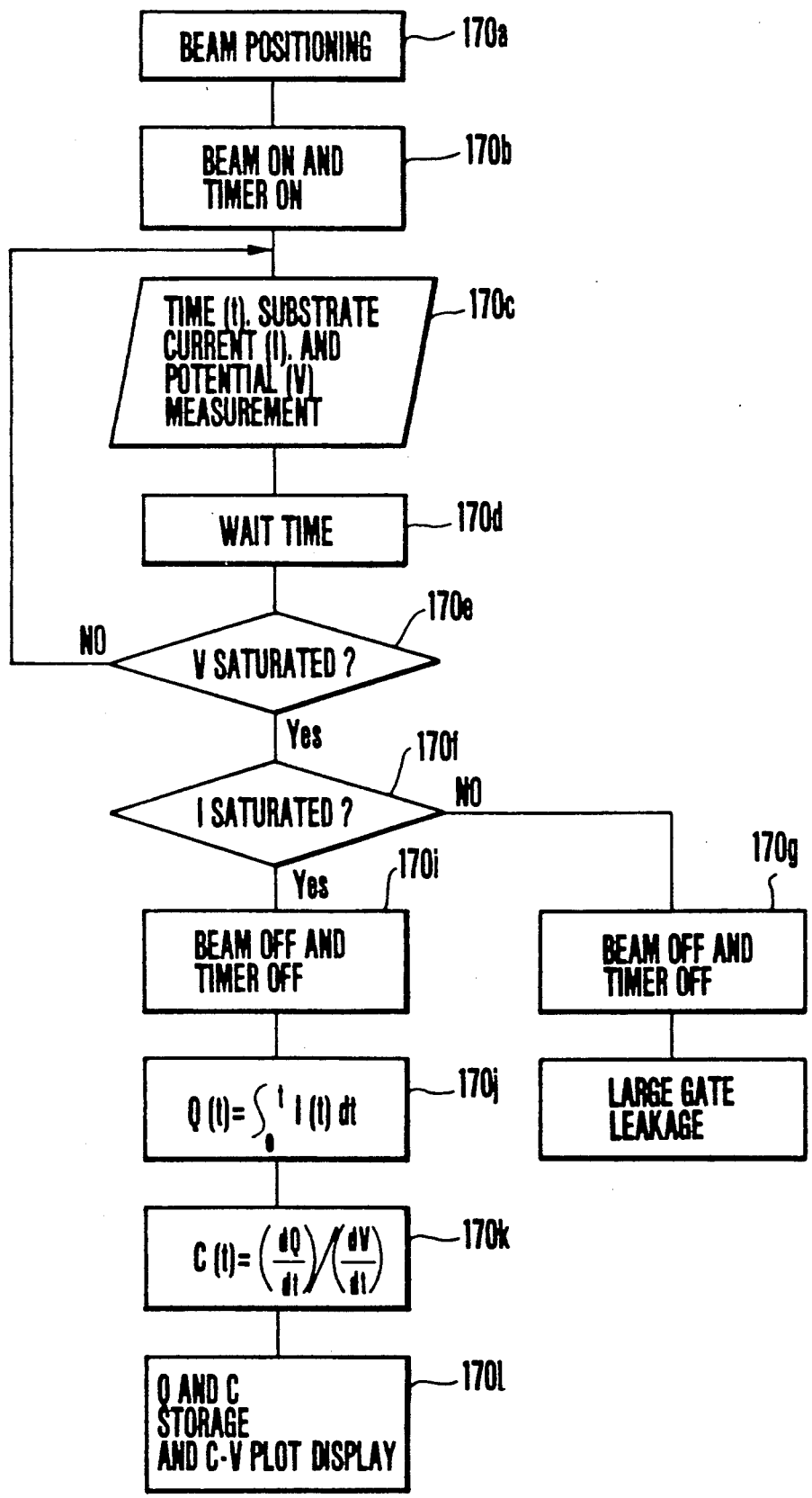

FIG. 29 shows capacitance measurement processing. In step 170a, the beam position is adjusted. In step 170b, beam radiation and timer are started. In step 170c, a time t, a substrate current I and an electrode potential V are measured for every time interval in step 170d. The measured values are stored in the RAM. The time interval may be constant. However, since changes in radiation point potential and substrate current are large immediately after the point is irradiated with the charged beam, as shown in FIG. 7, the initial time interval is preferably short and the subsequent time intervals are then increased to achieve effective measurement. In step 170e, when the radiation point potential is saturated, primary charge beam radiation and the timer are stopped, and the flow advances to step 170f. When the substrate current is not saturated even if the electrode potential is saturated, a large leakage is present. In this case, the flow advances from step 170f to step 170g. Primary charged beam radiation and the timer are stopped in step 170g, and the CPU determines that a gate leakage is large. In this case, the capacitance is not measured. In step 170f, when the substrate current is saturated, the flow advances to step 170i, and primary charge beam radiation and the timer are stopped. In step 170j, the charge change Q(t) as a function of time is calculated using substrate current change I(t) as a function of time as follows:

$$Q(t) = \int_0^t I(t)dt$$

In step 170k, a capacitance C is calculated as follows:

$$C(t)=(dQ/dt)/(dV/dt)$$

or $$C(t)=dQ/dV$$

When the beam current is constant, the capacitance may be calculated by $$C(t)=I/(dV/dt)$$

In step 170l, a C or C-V plot is displayed, and the calculated values are stored in a memory medium such as a floppy disk FD and processing is ended.

Capacitance Measurement II

Figure 30:
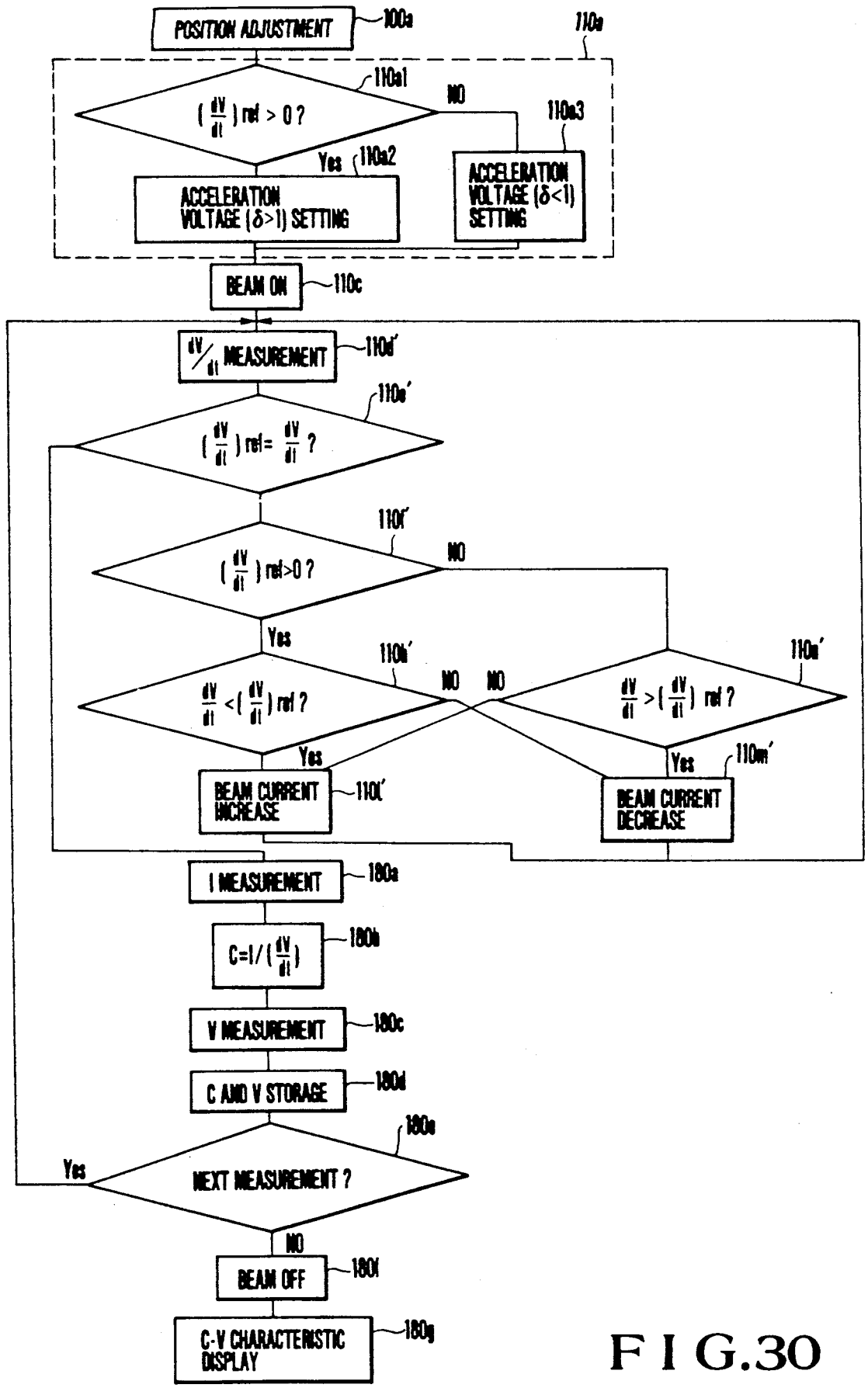

FIG. 30 shows another capacitance measurement processing. The beam current is made constant in FIG. 29. However, the beam current is controlled to set the potential change as a function of time to be constant in FIG. 30. Beam position adjustment, beam radiation condition setting and beam-ON operation are performed in the same manner as in steps 110a, 110a and 110c of FIG. 23.

After the operation of step 110c, the operations in steps 110d' to 110n' are similar to those in steps 110d to 110n of FIG. 23. In step 110d of FIG. 23, the potential is measured. However, in step 110d' of FIG. 30, dV/dt is measured. This difference can also be applied to the remaining steps up to 110n'. Steps 110e to 110f, 110h and 110n in FIG. 23 correspond to steps 110e' to 110f', 110h' and 110n' in FIG. 23, respectively.

If (dV/dt)ref is equal to dV/dt in step 110e', the flow advances to step 180a to measure a substrate current I. In step 180b, I/(dV/dt) is calculated. In other words, the capacitance C is calculated.

In step 180c, the potential V is measured. The measured values C and V are stored in the RAM in step 180d.

In step 180e, if the next measurement is required, the flow returns to step 110d' to calculate dV/dt again. However, if NO in step 180e, if the next measurement is not required, the beam radiation is stopped in step 180f. In step 180g, the C-V characteristics are displayed.

In addition to the tests described above, it is readily understood that the present invention can also be applied to disconnection checks, interwire connection checks and checks for characteristics of transistors included in an electronic device in accordance with a proper combination of potential and substrate current measurement.

What is claimed is:

1. An apparatus for testing an integrated electronic device having a substrate comprising:
    radiation means for radiating a predetermined position of said integrated electronic device with a primary charged beam to generate a substrate current and to generate secondary electrons emitted from said predetermined position;
    means for measuring said substrate current;
    potential measuring means for detecting said emitted secondary electrons to measure the potential of said predetermined position;
    a differentiator for differentiating an output from said potential measuring means as a function of time to generate a time rate of change signal;
    a differential amplifier for generating a difference signal in response to the difference between said time rate of change signal and a reference value;
    control means for controlling the current of said primary charged beam generated by said radiation means in response to said difference signal; and
    means for generating the ratio of said time rate of change signal to said substrate current to evaluate a capacitance.

2. A method of evaluating the capacitance of an integrated electronic device having a substrate, comprising the steps of:
    placing said integrated electronic device to be tested on a sample table;
    radiating a predetermined position of said integrated electronic device with a primary charged beam to generate a substrate current flowing through the substrate of said integrated electronic device to said sample table and to generate secondary electrons emitted from said predetermined position;
    measuring said substrate current;
    noncontactually measuring a potential of said predetermined position in accordance with said secondary electrons;
    generating a differential potential at said predetermined position; and
    determining the value of said capacitance of said predetermined position from the ratio of said substrate current and said differential potential.

3. An apparatus for testing an electronic device, comprising:
    means for radiating a charged beam onto a predetermined position on a first side of said electronic device;
    means for noncontactually measuring the electric potential (V) of said predetermined position;
    a beam control circuit for so controlling said means for radiating to equalize the electric potential (V) of said predetermined position with a first reference potential ($V_R$);
    an electric current measurement circuit connected to the side of said electronic device opposite said first side for measuring a substrate current ($I_S$) flowing through said electronic device;
    means for controlling said beam control circuit to sequentially vary the potential (V) of said predetermined position to be equal to at least a second reference potential;
    means for measuring a quantity (Q) of the charge stored in said electronic device based on a time integral $[(dI_X/dt)](I_X(t)dt)$ of the substrate current ($I_S$); and
    means responsive to a time differential of said quantity of the charge and a time differential (dV/dt) of the voltage (V) for measuring the capacitance (C) at said predetermined position where C=dQ/dV.

4. An apparatus for testing an electronic device, comprising:
    means for radiating a charged beam onto a predetermined position on one side of said electronic device;
    means for noncontactually measuring the electric potential (V) of said predetermined position;
    a beam control circuit for controlling a charged beam to equalize the potential (V) rise per unit of time (dV/dt) at said predetermined position with the rise per unit of time ($dV_R/dt$) of a reference potential;
    means connected to the side of said electronic device opposite said one side for measuring the substrate current ($I_X$) flowing through said electronic device; and
    means for measuring the capacitance (C) of said electronic device from the ratio between said potential rise per unit of time (dV/dt) and said substrate current ($I_X$) where C=$I_X$/(dV/dt).

5. A method of testing an electronic device, comprising the steps of:
    radiating a charged beam onto a predetermined position of said electronic device;
    noncontactually measuring the electric potential (V) of said predetermined position to control the charged beam so as to equalize said potential (V) with a first reference potential ($V_R$);
    measuring with a current meter connected to the side of said electronic device opposite the side being radiated by said charged beam, the substrate current ($I_X$) flowing through said electronic device when said potential (V) saturates at the level of said first reference potential ($V_R$);
    sequentially varying the potential (V) of said predetermined position to at least a second reference potential;
    repeating said step of noncontactually measuring and said step of measuring with a current meter to measure said substrate current ($I_X$) at said at least second reference potential;
    measuring the quantity (Q) of the charge stored in said electronic device based on a time integral ($I_X(t)dt$) of the substrate current ($I_S$); and
    measuring the capacitance (C) of said electronic device, from the ratio between a time differential of said potential (dv/dt) and a time differential of said quantity (Q) (dQ/dt) where $C = dQ/dV$.

6. A method of testing an electronic device, comprising the steps of:

radiating a charged beam onto a predetermined portion of said electronic device;

noncontactually measuring the electric potential (V) of said predetermined portion;

controlling the charged beam so as to equalize the potential rise per unit of time (dV/dt) at said predetermined portion with the rise per unit of time ($dV_R/dt$) of a reference potential;

measuring with a current meter connected to the side of said electronic device opposite the side being radiated by said charged beam, the substrate current ($I_X$) flowing through the device under the condition in which the potential rise (dV/dt) of said predetermined portion equals said reference potential rise ($dV_R/dt$); and measuring the capacitance (C) from the ratio between the potential rise (dV/dt) and the substrate current ($x$) where $C = I_X/(dV/dt)$.

* * * * *

UNITED STATES PATENT AND TRADEMARK OFFICE
CERTIFICATE OF CORRECTION

PATENT NO. : 5,097,204

DATED : March 17, 1992

INVENTOR(S) : Yoshizawa et al

It is certified that error appears in the above-identified patent and that said Letters Patent is hereby corrected as shown below:

Column 1, line 64, after "device" insert ---- . ----.

Column 2, line 10, after "position" insert ---- . ----.

Column 6, line 6, after "obtained" insert ---- . ----.

Column 6, line 12, after "practically" insert ---- . ----.

Column 6, line 18, delete "G value of" and insert ---- value of G ----.

Column 7, line 1, delete "subsrate" and insert ---- substrate ----.

Column 11, line 59, after "method" insert ---- . ----.

Column 12, line 5, after "obtained" insert ---- . ----.

Column 12, line 16, after "current" insert ---- . ----.

Column 12, line 24, after "manner" insert ---- . ----.

Column 15, line 18, delete "when" and insert ---- (when ----.

Column 15, line 64, after "computer" insert ---- . ----.

Column 17, line 2, delete "100m" and insert ---- 100j ----.

Column 17, line 3, delete "100d" and insert ---- 100k ----.

Column 17, line 20, delete "110a1" and insert ---- 110a1 ----.

UNITED STATES PATENT AND TRADEMARK OFFICE
CERTIFICATE OF CORRECTION

PATENT NO. : 5,097,204
DATED : March 17, 1992
INVENTOR(S) : Yoshizawa et al

It is certified that error appears in the above-identified patent and that said Letters Patent is hereby corrected as shown below:

Column 17, line 32, delete "110" and insert ---- 110i ----.

Column 18, line 1, delete "step 100b,".

Column 18, line 44, after "adjusted" insert ---- . ----.

Column 22, line 17, delete "[(dI$_x$/dt)](I$_x$(t)dt)" and insert ---- (I$_S$(t)dt) ----.

Column 22, line 20, after "charge" insert ---- (dQ/dt) ----.

Column 22, line 37, delete "(I$_X$) and insert ---- (I$_S$) ----.

Column 22, line 42, delete "(I$_X$)" and insert ---- (I$_S$) ----; same line, delete "C=I$_X$/(dV/dt)." and insert ---- C=I$_S$/(dV/dt). ----.

Column 22, line 54, delete "(I$_X$)" and insert ---- (I$_S$) ----.

Column 22, line 62, delete "(I$_X$)" and insert ---- (I$_S$) ----.

Column 22, line 66, delete "(I$_X$(t)dt)" and insert ---- (I$_S$(t)dt) ----.

Column 24, line 6, delete "(I$_X$)" and insert ---- (I$_S$) ----.

UNITED STATES PATENT AND TRADEMARK OFFICE
CERTIFICATE OF CORRECTION

PATENT NO. : 5,097,204
DATED : March 17, 1992
INVENTOR(S) : Yoshizawa et al

It is certified that error appears in the above-identified patent and that said Letters Patent is hereby corrected as shown below:

Column 24, line 12, delete "(x)" and insert ---- $(I_S)$ ----; same line, delete "$C=I_x/(dV/dt)$" and insert ---- $C=I_S/(dV/dt)$ ----.

Signed and Sealed this

Twelfth Day of October, 1993

Attest:

BRUCE LEHMAN

*Attesting Officer*  *Commissioner of Patents and Trademarks*